(12) United States Patent  
Nakanishi et al.

(10) Patent No.: US 10,381,416 B2  
(45) Date of Patent: Aug. 13, 2019

(54) DISPLAY DEVICE AND COLOR INPUT METHOD

(71) Applicant: Japan Display Inc., Minato-ku (JP)

(72) Inventors: Takayuki Nakanishi, Minato-ku (JP); Tatsuya Yata, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/145,265

(22) Filed: May 3, 2016

(65) Prior Publication Data

US 2016/0342043 A1 Nov. 24, 2016

(30) Foreign Application Priority Data

May 19, 2015 (JP) .................................. 2015-102208

(51) Int. Cl.
| | |
|---|---|
| *H01L 27/32* | (2006.01) |
| *G02F 1/1343* | (2006.01) |
| *G09G 3/3225* | (2016.01) |

(52) U.S. Cl.
CPC ....... *H01L 27/3218* (2013.01); *G09G 3/3225* (2013.01); *G02F 2001/134345* (2013.01); *G02F 2201/52* (2013.01); *G09G 2300/0452* (2013.01); *G09G 2300/0456* (2013.01); *G09G 2340/06* (2013.01); *G09G 2360/144* (2013.01); *H01L 27/3213* (2013.01); *H01L 27/3216* (2013.01)

(58) Field of Classification Search
CPC ........... G06F 1/134336; H01L 27/3213; H01L 27/3216; H01L 27/3218; G02F 2201/52
See application file for complete search history.

(56) References Cited

U.S. PATENT DOCUMENTS

2004/0222999 A1* 11/2004 Choi ................... G09G 3/3225
345/589
2005/0225574 A1  10/2005 Brown Elliot et al.
(Continued)

FOREIGN PATENT DOCUMENTS

| CN | 1551707 A | 12/2004 |
|---|---|---|
| CN | 2906675 Y | 5/2007 |

(Continued)

OTHER PUBLICATIONS

Korean Office Action dated Jul. 19, 2017 in Korean Patent Application No. 10-2016-0060293 (with English translation).

(Continued)

*Primary Examiner* — Samantha (Yuehan) Wang
*Assistant Examiner* — Khoa Vu
(74) *Attorney, Agent, or Firm* — Oblon, McClelland, Maier & Neustadt, L.L.P.

(57) ABSTRACT

According to an aspect, a display device includes: a plurality of pixels arranged at positions corresponding to coordinates in a row and a column directions; and a plurality of sub-pixels arranged among the pixels. The pixels and the sub-pixels are arranged in a staggered manner. Each of colors of the sub-pixels is any of a first primary color, a second primary color, and a third primary color. The sub-pixels are arranged so that a sub-pixel of the first primary color, a sub-pixel of the second primary color, and a sub-pixel of the third primary color are adjacent to each of the pixels. Each of colors of the pixels is a high luminance color having higher luminance than that of the colors of the sub-pixels.

13 Claims, 20 Drawing Sheets

(56) References Cited

U.S. PATENT DOCUMENTS

| | | |
|---|---|---|
| 2005/0225575 A1 | 10/2005 | Brown Elliott et al. |
| 2008/0316235 A1* | 12/2008 | Okazaki ............ G02F 1/133514 345/694 |
| 2010/0091032 A1* | 4/2010 | Ueki ................... G09G 3/2003 345/590 |
| 2012/0229529 A1* | 9/2012 | Tomizawa ........... G09G 3/2003 345/690 |
| 2012/0242719 A1* | 9/2012 | Klompenhouwer ......................... G09G 3/2074 345/690 |
| 2015/0213748 A1* | 7/2015 | Park ..................... G09G 3/2003 345/55 |
| 2015/0237236 A1* | 8/2015 | Elliott .................. G09G 3/2003 345/600 |
| 2016/0286108 A1* | 9/2016 | Fettig ................... H04N 5/2355 |
| 2016/0358985 A1* | 12/2016 | Bai ..................... H01L 27/3218 |

FOREIGN PATENT DOCUMENTS

| | | |
|---|---|---|
| JP | 2007-532949 A | 11/2007 |
| JP | 2011-164464 | 8/2011 |
| JP | 2012-53489 A | 3/2012 |
| JP | 2014-48323 A | 3/2014 |
| JP | 2015-82024 A | 4/2015 |
| KR | 10-2005-0067646 A | 7/2005 |
| KR | 10-2014-0116802 A | 10/2014 |
| WO | WO 2005/101807 A2 | 10/2005 |

OTHER PUBLICATIONS

Office Action dated Dec. 18, 2018 in Japanese Patent Application No. 2015-102208, 7 pages (with English language translation).

Office Action dated Nov. 26, 2018 in Chinese Patent Application No. 201610333109.6 with English translation.

Office Action dated Jun. 5, 2018, in Chinese Patent Application No. 201610333109.6. with English-language Translation.

* cited by examiner

DISPLAY DEVICE AND COLOR INPUT METHOD

CROSS-REFERENCE TO RELATED APPLICATIONS

This application claims priority from Japanese Application No. 2015-102208, filed on May 19, 2015, the contents of which are incorporated by reference herein in its entirety.

BACKGROUND

1. Technical Field

The present invention relates to a display device.

2. Description of the Related Art

Known are display devices in which one pixel includes four sub-pixels of red (R), green (G), blue (B), and white (W).

To achieve higher resolution in display devices in the related art, a mounting area that can be assigned to one sub-pixel is extremely small because four sub-pixels each of which is smaller than one pixel are arranged for one pixel. Accordingly, the mounting of a thin film transistor (TFT) and a color filter is difficult. When the number of arranged sub-pixels is simply four times the number of pixels corresponding to resolution, driving power for the sub-pixels is considerably increased in accordance with higher resolution, so that it is difficult to save electric power.

For the foregoing reasons, there is a need for a display device that can suppress reduction in the mounting area assigned to one sub-pixel in accordance with higher resolution. There is also a need for a display device that can suppress an increase in driving power for the sub-pixels in accordance with higher resolution.

SUMMARY

According to an aspect, a display device includes: a plurality of pixels arranged at positions corresponding to coordinates in a row and a column directions; and a plurality of sub-pixels arranged among the pixels. The pixels and the sub-pixels are arranged in a staggered manner. Each of colors of the sub-pixels is any of a first primary color, a second primary color, and a third primary color. The sub-pixels are arranged so that a sub-pixel of the first primary color, a sub-pixel of the second primary color, and a sub-pixel of the third primary color are adjacent to each of the pixels. Each of colors of the pixels is a high luminance color having higher luminance than that of the colors of the sub-pixels.

According to another aspect, a display device includes: a plurality of pixels arranged at positions corresponding to coordinates in a row and a column directions; and a plurality of sub-pixels arranged among the pixels. The pixels and the sub-pixels are arranged in a staggered manner. Each of colors of the sub-pixels is red or blue. The sub-pixels are arranged so that a sub-pixel of red and a sub-pixel of blue are adjacent to each of the pixels. Each of colors of the pixels is any of a plurality of high luminance colors having higher luminance than that of the colors of the sub-pixels. One of the high luminance colors is yellow.

DETAILED DESCRIPTION

Figure 1:
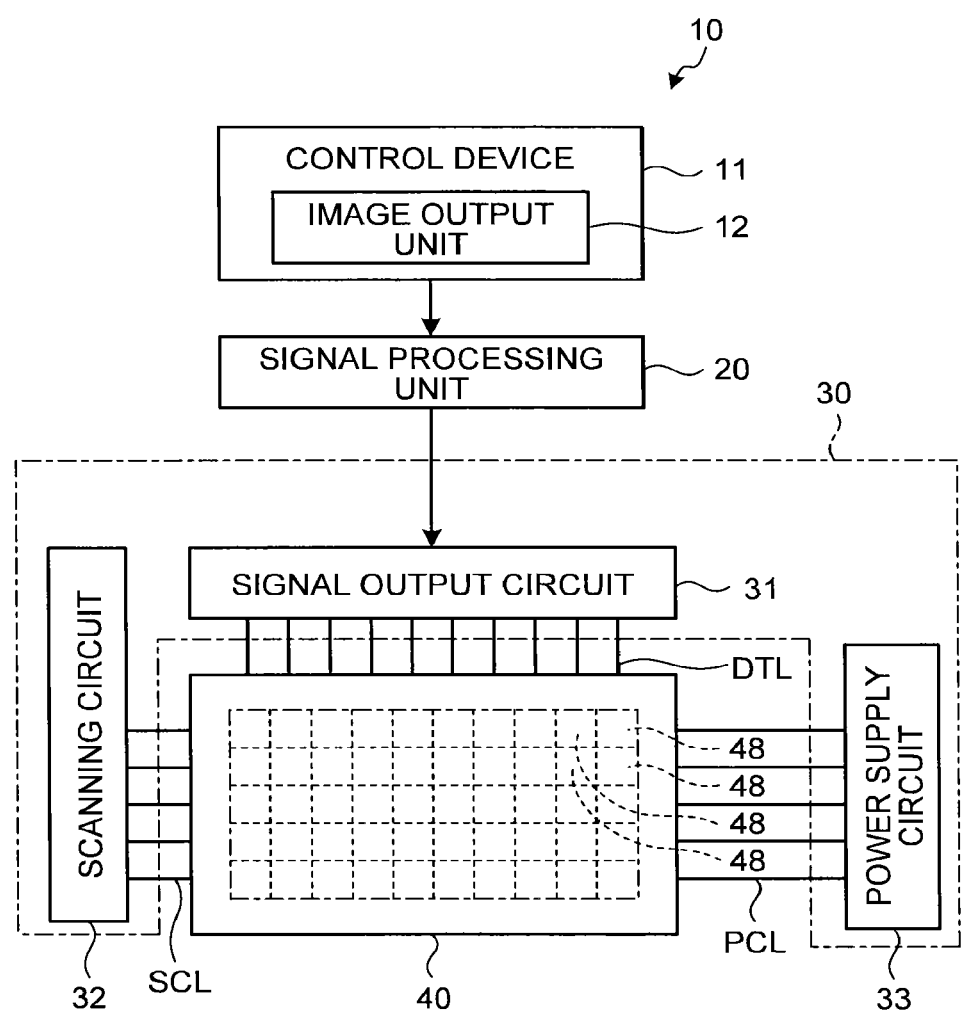
FIG. 1 is a block diagram illustrating an example of a configuration of a display device according to a first embodiment of the present invention.

The following describes embodiments of the present invention with reference to the accompanying drawings. The disclosure is merely an example, and the present invention naturally encompasses appropriate modifications maintaining the gist of the present invention that is easily conceivable by those skilled in the art. To further clarify the description, the width, the thickness, the shape, and the like of each component may be schematically illustrated in the drawings as compared with an actual aspect. However, this is merely an example and interpretation of the present invention is not limited thereto. The same elements as those described in the drawings that have already been discussed are denoted by the same reference numerals through the description and the drawings, and detailed descriptions thereof will not be repeated in some cases.

First Embodiment

FIG. 1 is a block diagram illustrating an example of a configuration of a display device 10 according to a first embodiment of the present invention. As illustrated in FIG. 1, the display device 10 according to the first embodiment includes a signal processing unit 20, an image-display-panel driving unit 30, and an image display panel 40. The signal processing unit 20 is a circuit that receives an input signal (RGB data) from an image output unit 12 of a control device 11, generates a signal by performing predetermined data-conversion processing on the input signal, and transmits the resultant signal to components of the display device 10. The image-display-panel driving unit 30 is a circuit that controls the driving of the image display panel 40 based on the signal from the signal processing unit 20. The image display panel 40 is a self-luminous type image display panel that displays an image by causing a self-luminous body of a pixel to be lit based on the signal from the image-display-panel driving unit 30.

Figure 2:
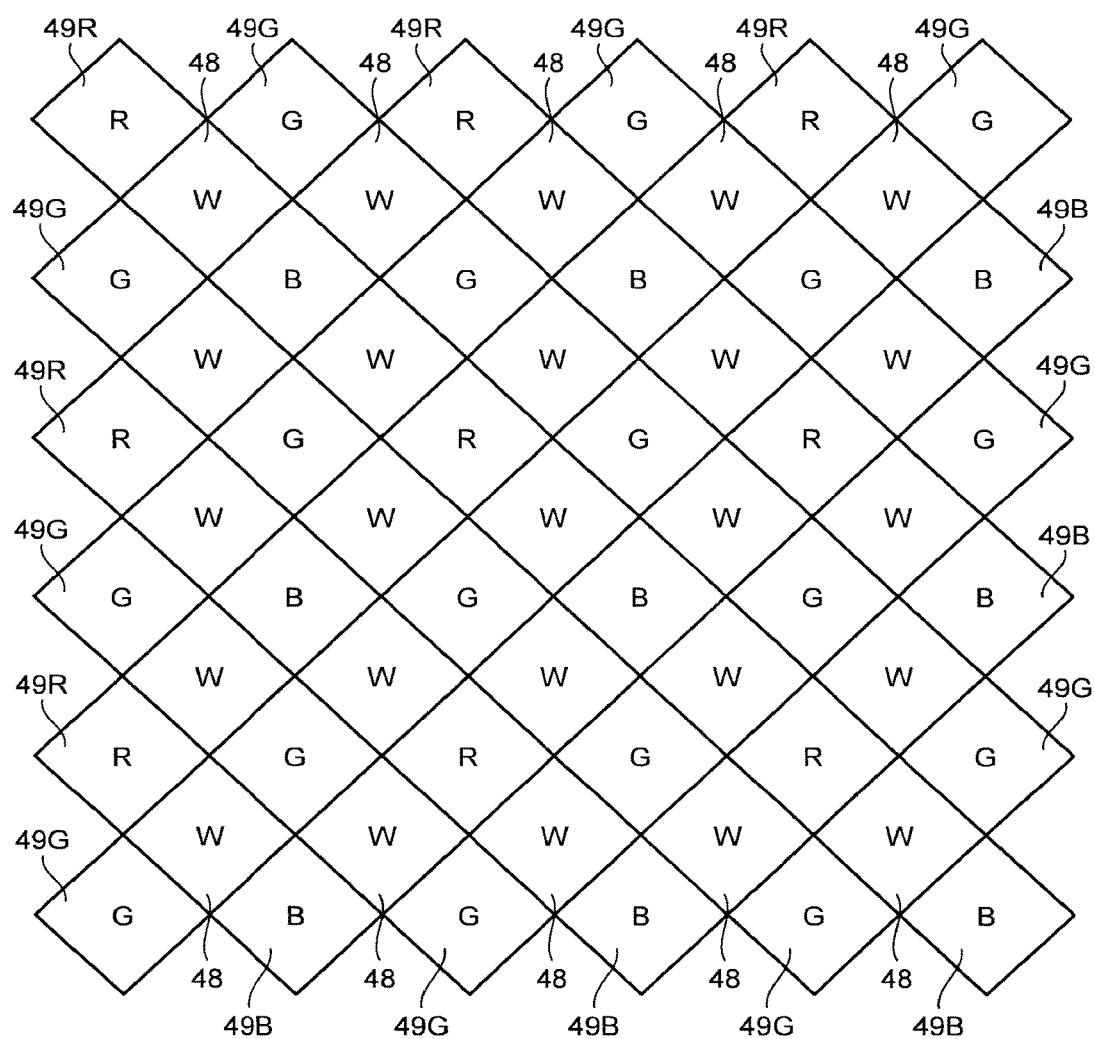
FIG. 2 is a schematic diagram illustrating an arrangement of pixels and sub-pixels of an image display panel according to the first embodiment.
Figure 3:
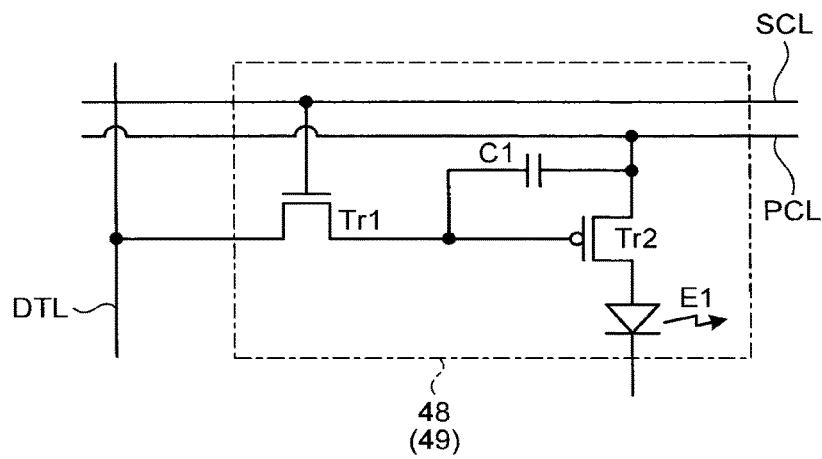
FIG. 3 is a diagram illustrating a lighting drive circuit for the pixels and the sub-pixels of the image display panel according to the first embodiment.
Figure 4:
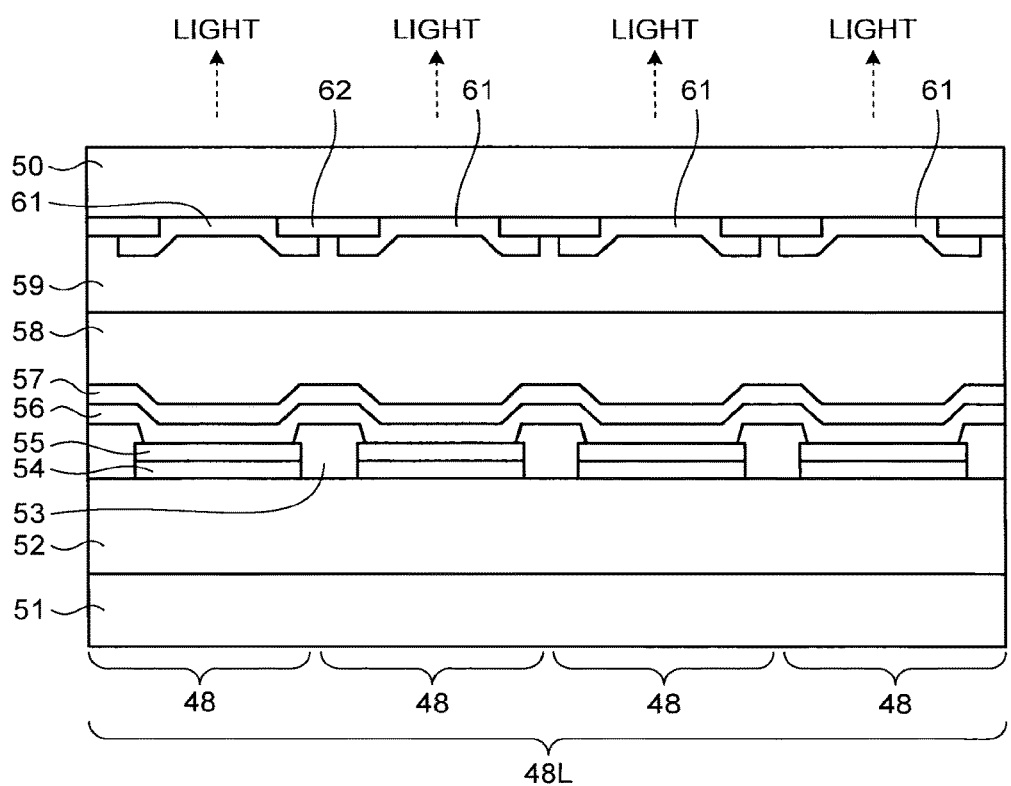
FIG. 4 is a diagram illustrating a cross-sectional structure of the image display panel according to the first embodiment.
Figure 5:
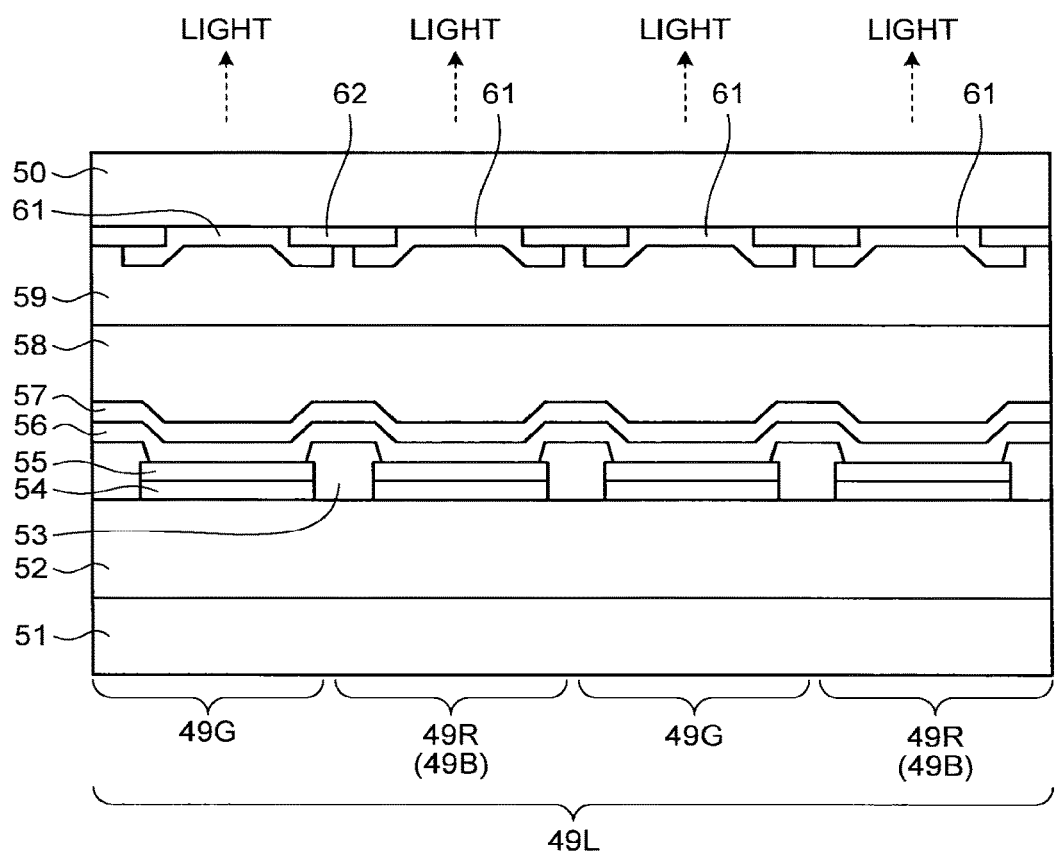
FIG. 5 is a diagram illustrating a cross-sectional structure of the image display panel according to the first embodiment.

FIG. 2 is a schematic diagram illustrating an arrangement of pixels and sub-pixels of the image display panel 40 according to the first embodiment. FIG. 3 is a diagram illustrating a lighting drive circuit for the pixels and the sub-pixels of the image display panel 40 according to the first embodiment. FIGS. 4 and 5 are diagrams illustrating a cross-sectional structure of the image display panel according to the first embodiment. As illustrated in FIG. 1, in the image display panel 40, a plurality of pixels 48 are arranged in a two-dimensional matrix (rows and columns). In the image display panel 40, a plurality of sub-pixels 49 are arranged in a two-dimensional matrix (rows and columns) (refer to FIG. 2). The sub-pixels 49 are not illustrated in FIG. 1.

In the image display panel 40, the pixels 48 and the sub-pixels 49 are arranged in a staggered manner. Specifically, as illustrated in FIG. 2 for example, a row of pixels 48 and a row of sub-pixels 49 are alternately arranged along a column direction in the image display panel 40. Pixels 48 constituting a row of pixels 48 and sub-pixels 49 constituting a row of sub-pixels 49 are alternately arranged along the column direction in a staggered manner. Pixels 48 constituting rows of pixels 48 opposed to each other across a row of sub-pixels 49 are arranged along the column direction. Sub-pixels 49 constituting rows of sub-pixels 49 opposed to each other across a row of pixels 48 are arranged along the column direction. Hereinafter, a column including pixels 48 arranged along the column direction is assumed to be a column of pixels 48. A column including sub-pixels 49 arranged along the column direction is assumed to be a column of sub-pixels 49. In FIG. 2 and other drawings, a character "W" representing white (W) denotes a pixel 48, a character "R" representing red (R) denotes a first sub-pixel 49R, a character "G" representing green (G) denotes a second sub-pixel 49G, and a character "B" representing blue (B) denotes a third sub-pixel 49B.

The color of each of the sub-pixels 49 is any of a first primary color, a second primary color, and a third primary color. Specifically, as illustrated in FIG. 2 for example, the color of each of the sub-pixels 49 according to the first embodiment is any of red (R) as the first primary color, green (G) as the second primary color, and blue (B) as the third primary color.

The sub-pixels 49 are arranged so that a sub-pixel of the first primary color, a sub-pixel of the second primary color, and a sub-pixel of the third primary color are adjacent to each of the pixels 48. Specifically, as illustrated in FIG. 2 for example, the sub-pixels 49 are arranged so that the first sub-pixel 49R as the sub-pixel of red (R), the second sub-pixel 49G as the sub-pixel of green (G), and the third sub-pixel 49B as the sub-pixel of blue (B) are adjacent to one pixel 48. Hereinafter, in descriptions in which the first sub-pixel 49R, the second sub-pixel 49G, and the third sub-pixel 49B are not required to be distinguished from each other, or in which all of the sub-pixels 49R, 49G, and 49B are included, the sub-pixels 49R, 49G, and 49B may be simply described as the sub-pixels 49.

More specifically, in the first embodiment, a ratio among the number of first sub-pixels 49R, the number of second sub-pixels 49G, and the number of third sub-pixels 49B is 1:2:1. In the first embodiment, the sub-pixels 49 are arranged so that one first sub-pixel 49R, two second sub-pixels 49G, and one third sub-pixel 49B are adjacent to one pixel 48. In the row of sub-pixels 49, the second sub-pixel 49G and one of the first sub-pixel 49R and the third sub-pixel 49B are alternately arranged in the row direction. The number of colors of the sub-pixels 49 included in one row of sub-pixels 49 is two, and one of the colors is green (G). In the column of the sub-pixels 49, the second sub-pixel 49G and one of the first sub-pixel 49R and the third sub-pixel 49B are alternately arranged in the column direction. The number of colors of the sub-pixels 49 included in one column of the sub-pixels 49 is two, and one of the colors is green (G).

The color of the pixel is a high luminance color with higher luminance than that of the colors of the sub-pixels. Specifically, as illustrated in FIG. 2 for example, the high luminance color as the color of the pixel 48 according to the first embodiment is white (W).

The pixel 48 and the sub-pixel 49 each include a lighting drive circuit. Specifically, as illustrated in FIG. 3, the lighting drive circuit includes a control transistor Tr1, a driving transistor Tr2, and a charge holding capacitor C1. A gate of the control transistor Tr1 is coupled to a scanning line SCL, a source thereof is coupled to a signal line DTL, and a drain thereof is coupled to a gate of the driving transistor Tr2. One end of the charge holding capacitor C1 is coupled to the gate of the driving transistor Tr2, and the other end thereof is coupled to a source of the driving transistor Tr2. The source of the driving transistor Tr2 is coupled to a power supply line PCL, and a drain of the driving transistor Tr2 is coupled to an anode of an organic light emitting diode E1 serving as a self-luminous body. A cathode of the organic light emitting diode E1 is coupled, for example, to a reference potential (for example, a ground). FIG. 3 illustrates an example in which the control transistor Tr1 is an n-channel transistor and the driving transistor Tr2 is a p-channel transistor. However, a polarity of each transistor is not limited thereto. The polarity of each of the control transistor Tr1 and the driving transistor Tr2 may be determined as needed.

The image-display-panel driving unit 30 is a control device for the image display panel 40, and includes a signal output circuit 31, a scanning circuit 32, and a power supply circuit 33. The signal output circuit 31 is electrically coupled to the image display panel 40 via the signal line DTL. The signal output circuit 31 holds input image output signals, and sequentially outputs the image output signals to the pixel 48 and the sub-pixel 49 (hereinafter, referred to as a pixel and the like) of the image display panel 40. The scanning circuit 32 is electrically coupled to the image display panel 40 via the scanning line SCL. The scanning circuit 32 selects the pixel and the like in the image display panel, and controls ON/OFF of a switching element (for example, a thin film transistor (TFT)) for controlling an operation (light emission intensity) of the pixel and the like. The power supply circuit 33 supplies electric power to the organic light emitting diode E1 of the pixel and the like via the power supply line PCL.

As illustrated in FIGS. 4 and 5, the image display panel 40 includes a substrate 51, insulating layers 52 and 53, a reflective layer 54, a lower electrode 55, a self-luminous layer 56, an upper electrode 57, insulating layers 58 and 59, a color filter 61 serving as a color conversion layer, a black matrix 62 serving as a light shielding layer, and a substrate 50. The substrate 51 is a semiconductor substrate made of silicon and the like, a glass substrate, a resin substrate, and the like, and forms or holds the lighting drive circuit and the like. The insulating layer 52 is a protective film that protects the lighting drive circuit and the like, and may be made of silicon oxide, silicon nitride, and the like. The lower electrode 55 is provided to each of the first sub-pixel 49R, the second sub-pixel 49G, the third sub-pixel 49B, and the pixel 48, and is an electric conductor serving as an anode (positive pole) of the organic light emitting diode E1 described above. The lower electrode 55 is a translucent electrode made of a translucent conductive material (translucent conductive oxide) such as indium tin oxide (ITO). The insulating layer 53 is an insulating layer that is called a bank and partitions the first sub-pixel 49R, the second sub-pixel 49G, the third sub-pixel 49B, and the pixel 48 from each other. The reflective layer 54 is made of a material having metallic luster that reflects light from the self-luminous layer 56 such as silver, aluminum, and gold. The self-luminous layer 56 includes an organic material, and includes a hole injection layer, a hole transport layer, a light emitting layer, an electron transport layer, and an electron injection layer (not illustrated).

As a layer that generates positive holes, for example, it is preferable to use a layer including an aromatic amine compound and a substance exhibiting an electron accepting property to the compound. The aromatic amine compound is a substance having an arylamine skeleton. Among aromatic amine compounds, especially preferred is an aromatic amine compound including triphenylamine in the skeleton thereof and having a molecular weight of 400 or more. Among aromatic amine compounds including triphenylamine in the skeleton thereof, especially preferred is an aromatic amine compound including a condensed aromatic ring such as a naphthyl group in the skeleton thereof. When the aromatic amine compound including triphenylamine and a condensed aromatic ring in the skeleton thereof is used, heat resistance of a light emitting element is improved. Specific examples of the aromatic amine compound include, but are not limited to, 4,4'-bis [N-(1-naphthyl)-N-phenylamino] biphenyl (abbreviated as α-NPD), 4,4'-bis [N-(3-methylphenyl)-N-phenylamino] biphenyl (abbreviated as TPD), 4,4',4''-tris (N,N-diphenylamino) triphenylamine (abbreviated as TDATA), 4,4',4''-tris [N-(3-methylphenyl)-N-phenylamino] triphenylamine (abbreviated as MTDATA), 4,4'-bis [N-{4-(N,N-di-m-tolylamino) phenyl}-N-phenylamino] biphenyl (abbreviated as DNTPD), 1,3,5-tris [N,N-di(m-tolyl) amino] benzene (abbreviated as m-MTDAB), 4,4',4''-tris (N-carbazolyl) triphenylamine (abbreviated as TCTA), 2,3-bis (4-diphenylaminophenyl) quinoxaline (abbreviated as TPAQn), 2,2',3,3'-tetrakis (4-diphenylaminophenyl)-6,6'-bisquinoxaline (abbreviated as D-TriPhAQn), 2,3-bis {4-[N-(1-naphthyl)-N-phenylamino] phenyl}-dibenzo [f,h] quinoxaline (abbreviated as NPADiBzQn), etc. The substance exhibiting the electron accepting property to the aromatic amine compound is not specifically limited. For example, molybdenum oxide, vanadium oxide, 7,7,8,8-tetracyanoquinodimethane (abbreviated as TCNQ), and 2,3,5,6-tetrafluoro-7,7,8,8-tetracyanoquinodimethane (abbreviated as F4-TCNQ) can be used as the substance.

An electron transport substance is not specifically limited. For example, as the electron transport substance, metal complex such as tris (8-quinolinolato) aluminum (abbreviated as Alq$_3$), tris (4-methyl-8-quinolinolato) aluminum (abbreviated as Almq$_2$), bis (10-hydroxybenzo [h]-quinolinato) beryllium (abbreviated as BeBq$_2$), bis (2-methyl-8-quinolinolato)-4-phenylphenolate-aluminum (abbreviated as BAlq), bis [2-(2-hydroxyphenyl) benzoxazolato] zinc (abbreviated as Zn(BOX)$_2$), and bis [2-(2-hydroxyphenyl) benzothiazolato] zinc (abbreviated as Zn(BTZ)$_2$) can be used, and 2-(4-biphenylyl)-5-(4-tert-butylphenyl)-1,3,4-oxadiazole (abbreviated as PBD), 1,3-bis [5-(p-tert-butylphenyl)-1,3,4-oxadiazole-2-yl] benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), bathophenanthroline (abbreviated as BPhen), bathocuproin (abbreviated as BCP), and the like can also be used. A substance exhibiting an electron donating property to the electron transport substance is not specifically limited. For example, an alkali metal such as lithium and cesium, an alkaline-earth metal such as magnesium and calcium, and a rare earth metal such as erbium and ytterbium can be used as the substance. A substance selected from among alkali metal oxides and alkaline-earth metal oxides such as lithium oxide (Li$_2$O), calcium oxide (CaO), sodium oxide (Na$_2$O), potassium oxide (K$_2$O), and magnesium oxide (MgO) may be used as the substance exhibiting the electron donating property to the electron transport substance.

For example, to obtain red-based light emission, a substance exhibiting light emission having a peak of emission spectrum in a range from 600 nm to 680 nm can be used, such as 4-dicyanomethylene-2-isopropyl-6-[2-(1,1,7,7-tetramethyljulolidine-9-yl) ethenyl]-4H-pyrane (abbreviated as DCJTI), 4-dicyanomethylene-2-methyl-6-[2-(1,1,7,7-tetramethyljulolidine-9-yl) ethenyl]-4H-pyrane (abbreviated as DCJT), 4-dicyanomethylene-2-tert-butyl-6-[2-(1,1,7,7-tetramethyljulolidine-9-yl) ethenyl]-4H-pyrane (abbreviated as DCJTB), periflanthene, and 2, 5-dicyano-1,4-bis [2-(10-methoxy-1,1,7,7-tetramethyljulolidine-9-yl) ethenyl] benzene. To obtain green-based light emission, a substance exhibiting light emission having a peak of emission spectrum in a range from 500 nm to 550 nm can be used, such as N,N'-dimethylquinacridone (abbreviated as DMQd), coumarin 6, coumarin 545T, and tris (8-quinolinolato) aluminum (abbreviated as Alq$_3$). To obtain blue-based light emission, a substance exhibiting light emission having a peak of emission spectrum in a range from 420 nm to 500 nm can be used, such as 9,10-bis (2-naphthyl)-tert-butylanthracene (abbreviated as t-BuDNA), 9,9'-bianthryl, 9,10-diphenylanthracene (abbreviated as DPA), 9,10-bis (2-naphthyl) anthracene (abbreviated as DNA), bis (2-methyl-8-quinolinolato)-4-phenylphenolate-gallium (abbreviated as BGaq), and bis (2-methyl-8-quinolinolato)-4-phenylphenolate-aluminum (abbreviated as BAlq). In addition to the substances that emit fluorescence as described above, substances that emit phosphorescence can also be used as light-emitting substances, such as bis [2-(3,5-bis (trifluoromethyl) phenyl) pyridinato-N,C2'] iridium (III) picolinate (abbreviated as Ir(CF$_3$ppy)$_2$(pic)), bis [2-(4,6-difluorophenyl) pyridinato-N, C2'] iridium (III) acetylacetonate (abbreviated as FIr(acac)), bis [2-(4,6-difluorophenyl) pyridinato-N,C2'] iridium (III) picolinate (abbreviated as FIr(pic)), and tris (2-phenylpyridinato-N,C2') iridium (abbreviated as Ir(ppy)$_3$).

The upper electrode 57 is a translucent electrode made of a translucent conductive material (translucent conductive oxide) such as indium tin oxide (ITO). In the first embodiment, ITO is exemplified as the translucent conductive material, but the translucent conductive material is not limited thereto. As the translucent conductive material, a conductive material having another composition such as indium zinc oxide (IZO) may be used. The upper electrode 57 functions as a cathode (negative pole) of the organic light emitting diode E1. The insulating layer 58 is a sealing layer that seals the upper electrode described above, and can be made of silicon oxide, silicon nitride, and the like. The insulating layer 59 is a planarization layer for preventing unevenness from being generated due to the bank, and can be made of silicon oxide, silicon nitride, and the like. The substrate 50 is a translucent substrate that protects the entire image display panel 40, and can be a glass substrate, for example. FIGS. 4 and 5 illustrate an example in which the lower electrode 55 is the anode (positive pole) and the upper electrode 57 is the cathode (negative pole), but the embodiment is not limited thereto. The lower electrode 55 may be the cathode and the upper electrode 57 may be the anode. In this case, the polarity of the driving transistor Tr2 electrically coupled to the lower electrode 55 can be appropriately changed, and a stacking order of a carrier injection layer (the hole injection layer and the electron injection layer), a carrier transport layer (the hole transport layer and the electron transport layer), and the light emitting layer can be appropriately changed.

In FIG. 4, the pixels 48 arranged along a predetermined direction (for example, the row of pixels 48 or the column of the pixels 48 according to the first embodiment) are denoted by the reference numeral 48L. In FIG. 5, the sub-pixels 49 arranged along a predetermined direction (for example, the row of sub-pixels 49 or the column of the sub-pixels 49 according to the first embodiment) are denoted by the reference numeral 49L.

The image display panel 40 is a color display panel, and the color filter 61 that transmits light, from among light emitting components of the self-luminous layer 56, having a color corresponding to the color of the sub-pixel 49 is arranged between the sub-pixel 49 and an image observer. The image display panel 40 can emit light having a color corresponding to red (R), green (G), blue (B), and white (W). The color filter 61 is not necessarily arranged between the pixel 48 corresponding to white (W) and the image observer. In the image display panel 40, the light emitting component of the self-luminous layer 56 can emit light of each color of the first sub-pixel 49R, the second sub-pixel 49G, the third sub-pixel 49B, and the pixel 48 without using the color conversion layer such as the color filter 61. For example, in the image display panel 40, a transparent resin layer may be provided to the pixel 48 in place of the color filter 61 for color adjustment. In this way, the image display panel 40 thus provided with the transparent resin layer can suppress the occurrence of a large gap above the pixel 48.

Figure 6:
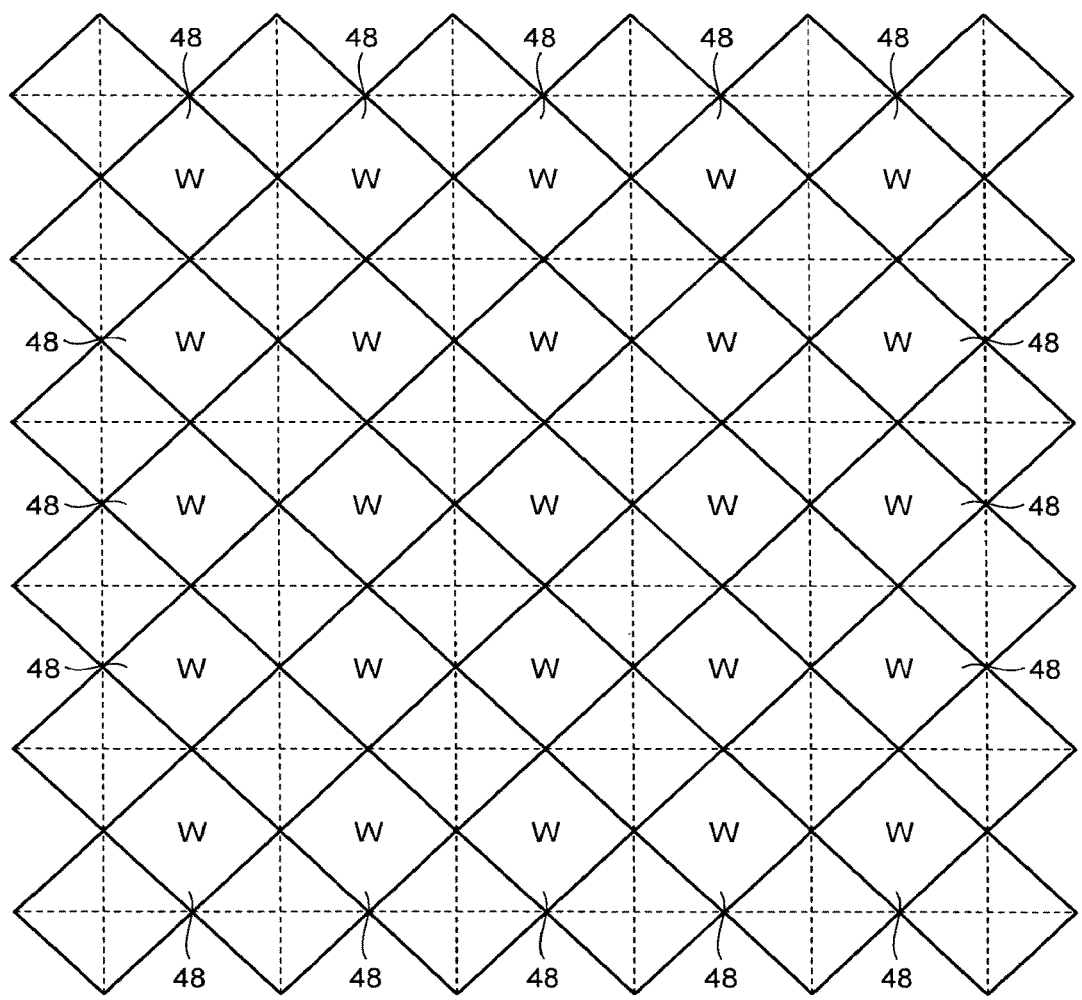
FIG. 6 is a schematic diagram illustrating a relation between coordinates in a row direction and a column direction and the arrangement of the pixels.

Next, the following describes a relation between the input signal, and the pixel 48 and the sub-pixel 49. FIG. 6 is a schematic diagram illustrating a relation between coordinates in a row direction and a column direction and the arrangement of the pixels 48. In FIG. 6 and FIGS. 7 to 9 described later, the coordinates in the row and the column directions are represented by a rectangle of dashed line, and one rectangle corresponds to one set of coordinates. As illustrated in FIG. 6, each of the pixels 48 is arranged at a position corresponding to the coordinates in the row and the column directions. For example, coordinates of one or more pixels constituting an input image from which the input signal is generated correspond to coordinates of one or more pixels 48 of the image display panel 40. When a ratio between the number of pixels of the input image and the number of pixels 48 of the image display panel 40 is 1:1 in both of the row and column directions, the coordinates of the input image correspond to the coordinates of the respective pixels 48 one to one. When the ratio is not 1:1, the coordinates of the pixels of the input image are associated with the coordinates of the respective pixels 48 of the image display panel 40 through pixel number changing processing of the input image for associating the coordinates performed by the control device 11 or the signal processing unit 20. The image display panel 40 can output a white component that can be output as white among color components indicated by the input signal while directly reflecting the coordinates in the row and the column directions indicated by the input signal. For example, when the image is displayed based on the input signals for a pixel region including 5×5 pixels 48 and the sub-pixels 49 adjacent to the pixels 48 illustrated in FIG. 6, the resolution of the image is 5×5. When each of the pixels 48 outputs the white component of the image, the image display panel 40 can directly reflect the resolution of the image regarding the white component. That is, with the image display panel 40 according to the first embodiment, real resolution can be obtained for the white component.

The input signal according to the first embodiment is RGB data, and may include information indicating a color component other than the white component. Thus, the signal processing unit according to the first embodiment extracts the white component as a component that can be output as white from among the color components indicated by the input signal, assigns the white component to the pixel 48, and assigns a component other than the white component among the color components indicated by the input signal to a sub-pixel 49.

Figure 7:
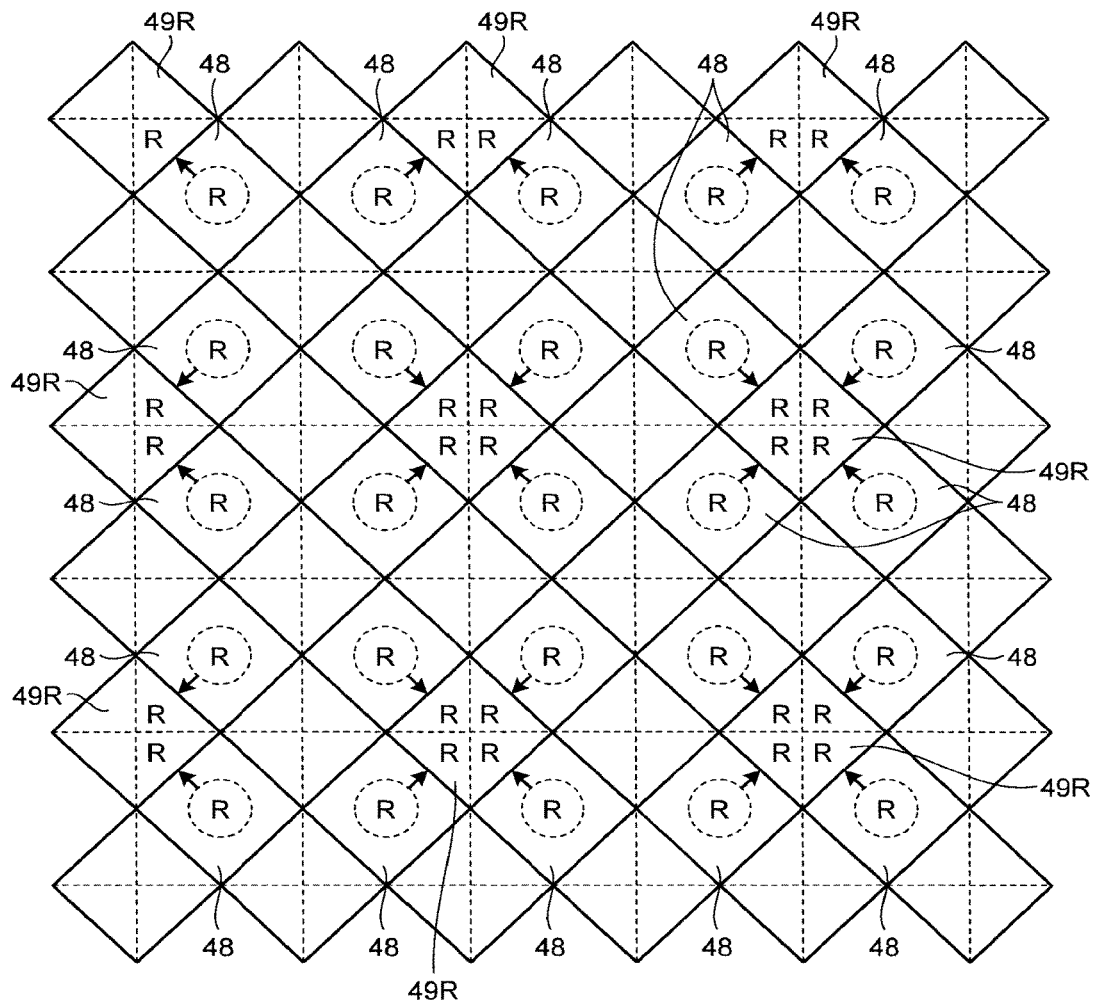
FIG. 7 is a schematic diagram illustrating a relation between the coordinates in the row and the column directions and the arrangement of the sub-pixels.
Figure 8:
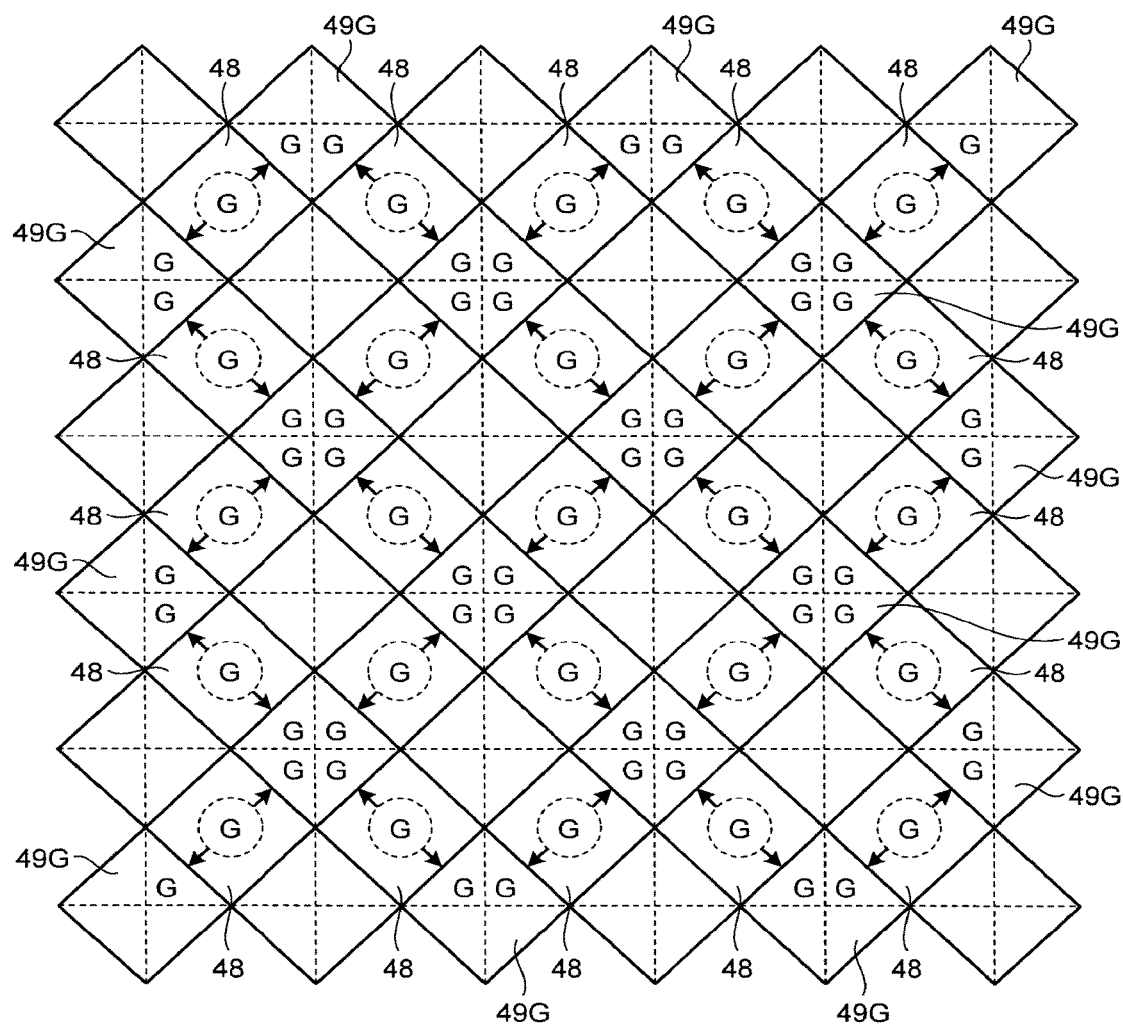
FIG. 8 is a schematic diagram illustrating a relation between the coordinates in the row and the column directions and the arrangement of the sub-pixels.
Figure 9:
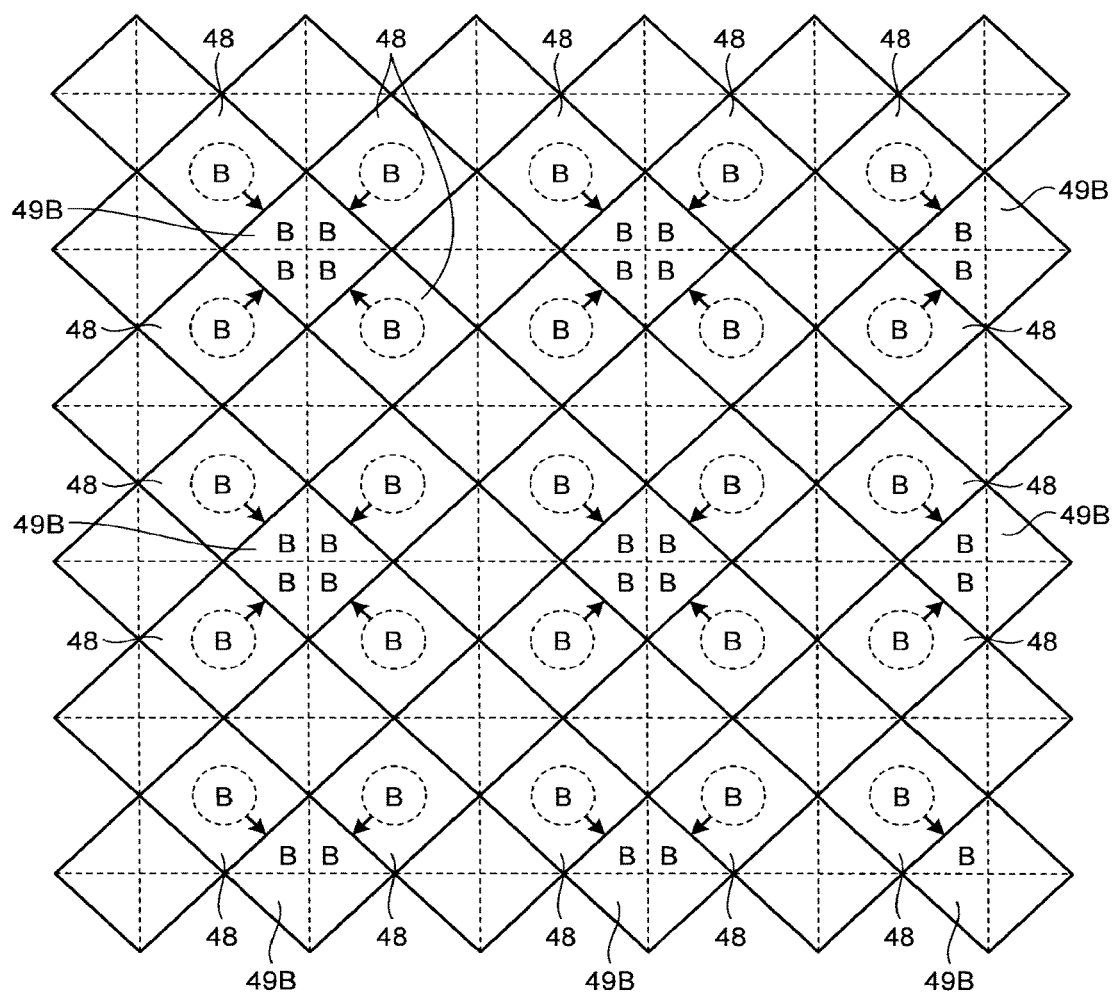
FIG. 9 is a schematic diagram illustrating a relation between the coordinates in the row and the column directions and the arrangement of the sub-pixels.

FIGS. 7, 8, and 9 are schematic diagrams illustrating a relation between the coordinates in the row and the column directions and the arrangement of the sub-pixels 49. As described above, in the image display panel 40, a plurality of sub-pixels 49 are arranged so that the first sub-pixel 49R as the sub-pixel of red (R), the second sub-pixel 49G as the sub-pixel of green (G), and the third sub-pixel 49B as the sub-pixel of blue (B) are adjacent to one pixel 48. The signal processing unit 20 assigns the components other than the white component to these sub-pixels 49. Specifically, as illustrated in FIG. 7, the signal processing unit 20 assigns the red component among the components other than the white component to the first sub-pixel 49R. As illustrated in FIG. 8, the signal processing unit 20 assigns the green component among the components other than the white component to the second sub-pixel 49G. As illustrated in FIG. 9, the signal processing unit 20 assigns the blue component among the components other than the white component to the third sub-pixel 49B. In FIGS. 7, 8, and 9, each of the components of red (R), green (G), and blue (B) among the components other than the white component indicated by the input signal is represented in a circle of dashed line, and a positional relation between the component and the sub-pixel 49 to which the component is assigned is represented by an arrow. In FIGS. 7, 8, and 9, the sub-pixel 49 is equally divided into four parts with a dashed line representing the coordinates. However, the four equally divided parts of the sub-pixel 49 do not each independently emit light. A light emitting state is controlled assuming that one sub-pixel 49 is one control unit.

Figure 10:
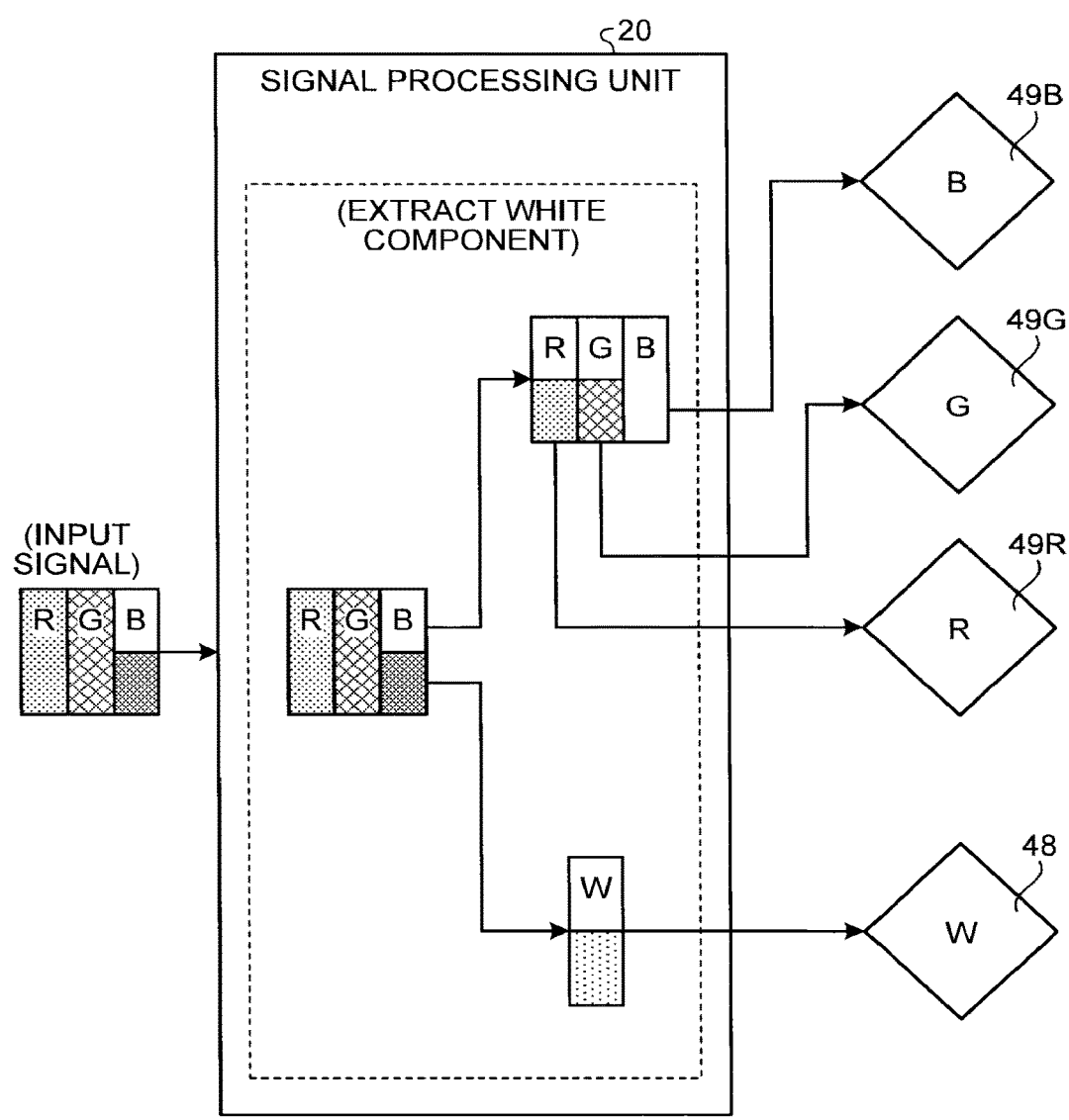
FIG. 10 is a schematic diagram illustrating an example of a method for dividing an input signal into a white component and components other than the white component to be assigned to the pixels and the sub-pixels.

FIG. 10 is a schematic diagram illustrating an example of a method for dividing the input signal into the white component and the components other than the white component to be assigned to the pixels 48 and the sub-pixels 49. For example, the input signal of (R, G, B)=(255, 255, 127) illustrated in FIG. 10 can be divided into the white component of (R, G, B)=(127, 127, 127) and the component of (R, G, B)=(128, 128, 0) other than the white component. The signal processing unit 20 extracts the white component from the color components indicated by the input signal to be assigned to the pixel 48. The signal processing unit 20 assigns the component of (R, G, B)=(128, 0, 0) in the component of (R, G, B)=(128, 128, 0) other than the white component to the first sub-pixel 49R. The signal processing unit 20 assigns the component of (R, G, B)=(0, 128, 0) in the component of (R, G, B)=(128, 128, 0) other than the white component to the second sub-pixel 49G. Two second sub-pixels 49G are adjacent to one pixel 48, so that the signal processing unit 20 assigns the component of (R, G, B)=(0, 128, 0) to be dispersed to the two second sub-pixels 49G. The signal processing unit 20 according to the first embodiment equally divides the green component to be assigned to the two second sub-pixels 49G. However, this is merely a specific example of a method for dispersing the component, and the embodiment is not limited thereto. A dispersion ratio of the green component with respect to the two second sub-pixels 49G can be appropriately changed.

In the example illustrated in FIG. 10, the blue component is not included in the component of (R, G, B)=(128, 128, 0) other than the white component, so that the third sub-pixel 49B is not lit. The white component is not necessarily extracted as much as possible. For example, assuming that the white component extracted from the input signal of (255, 255, 127) is (R, G, B)=(100, 100, 100), the third sub-pixel 49B can be lit corresponding to the blue component (27) included in the component of (R, G, B)=(155, 155, 27) other than the white component. In the input signal, an amount of white component extracted from the components that can be caused to be white light is freely determined. In the description with reference to FIG. 10, the pixel region of 5×5 is exemplified. However, the pixel region is not limited thereto. The same processing can be applied to any pixel region included in the image display panel 40.

As illustrated in FIG. 7, one to four pixels 48 are adjacent to one first sub-pixel 49R. Thus, the signal processing unit 20 assigns the red component to the first sub-pixel 49R such that the red component is collected from four pixels 48 at the maximum for one first sub-pixel 49R. As illustrated in FIGS. 8 and 9, also for the green component of the second sub-pixel 49G and the blue component of the third sub-pixel 49B, the signal processing unit 20 assigns the green component and the blue component to the second and third sub-pixels 49G and 49B, respectively, such that each of the green components and the blue components is collected from four pixels 48 at the maximum for each one of the second sub-pixel 49G and the third sub-pixel 49B. However, regarding the green component, the number of the second sub-pixels 49G is twice the number of the first sub-pixels 49R (the number of the third sub-pixels 49B) although one to four pixels 48 are adjacent to one second sub-pixel 49G, so that an amount of green components collected for one sub-pixel 49 is smaller than that of red components and blue components. Although FIGS. 7, 8, and 9 illustrate only the components assigned from the input signal at the coordinates corresponding to the illustrated pixel 48, the component corresponding to the color of the sub-pixel 49 is actually assigned also from the pixel 48 that is not illustrated among the pixels 48 adjacent to the sub-pixel 49.

Figure 11:
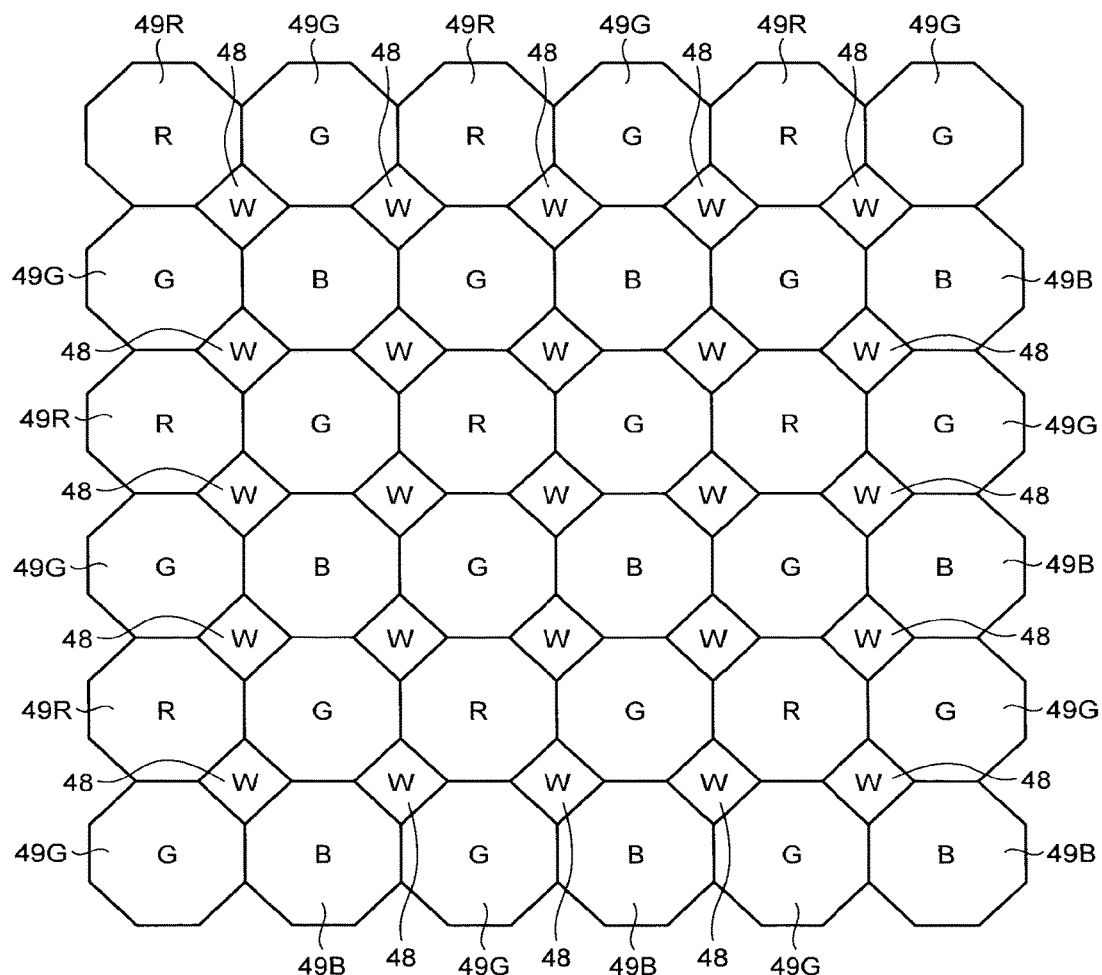
FIG. 11 is a diagram illustrating an example of size comparison between the pixels and the sub-pixels, and shapes of the pixels and the sub-pixels.

FIG. 11 is a diagram illustrating an example of size comparison between the pixels 48 and the sub-pixels 49, and shapes of the pixels 48 and the sub-pixels 49. As described above, a component other than the white component obtained from each of the input signals corresponding to the coordinates of a plurality of pixels 48 is assigned to a corresponding sub-pixel 49. For example, when a gradation value of the red component indicated by an input signal for one pixel 48 is within a range from 0 to 255, the gradation value assigned to one first sub-pixel 49R can be 0 to 1020. Thus, each of the sub-pixels 49 according to the first embodiment is provided to be able to exhibit a light emitting capability for outputting a component other than the white component obtained from each of the input signals corresponding to the coordinates of a plurality of pixels 48. The shapes of the pixel 48 and the sub-pixel 49 are determined considering such a light emitting capability. Specifically, as illustrated in FIG. 11 for example, a light emitting region of the sub-pixel 49 is provided to be larger than the light emitting region of the pixel 48. The sub-pixels 49 have octagonal light emitting regions adjacent to each other in the row and the column directions. Each of the pixels 48 is arranged in a region having a rectangular shape among octagonal sub-pixels 49, and has a light emitting region of the rectangular shape.

In the first embodiment, a component other than the white component in color components indicated by an input signal is assigned to a sub-pixel 49 adjacent to the pixel 48 at the coordinates of the input signal. However, the sub-pixel 49 to which the component is assigned and the coordinates of the input signal including the component are freely determined, and they can be determined based on an algorithm of signal processing performed by the signal processing unit 20.

In the first embodiment, the light emitting capability of each of the sub-pixels 49 included in the display device 10 may be higher than the light emitting capability required for a color gamut of the display device 10 reproduced by combining the colors of the sub-pixels 49. In this case, a color gamut the vertexes of which correspond to the colors of the sub-pixels and that represents a color range that can be output by the display device is larger than a color gamut of an image visually recognized as a result of display output by the display device and contains the color gamut of the image. The following describes such a color gamut with reference to FIG. 12.

Figure 12:
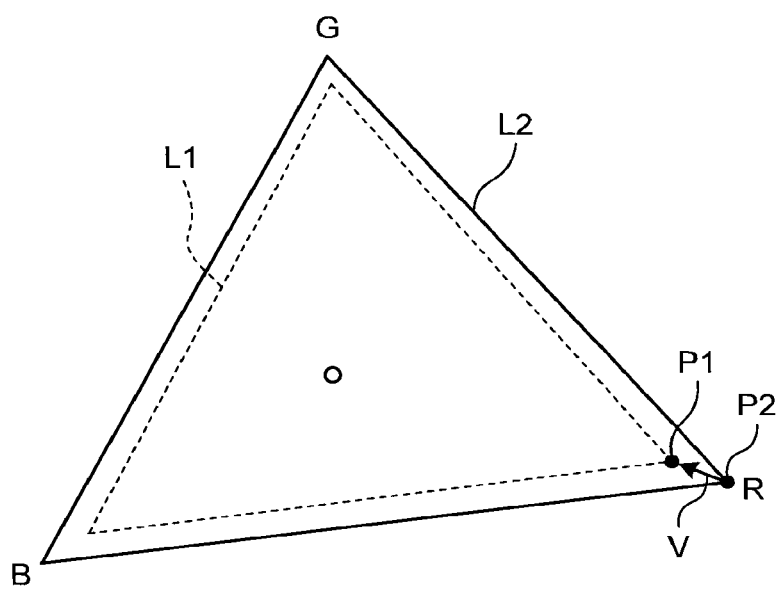
FIG. 12 is a schematic diagram illustrating a relation between a color gamut that can be reproduced with a light emitting capability of each sub-pixel included in the display device and a color gamut of the display device that is actually output by combining colors of the sub-pixels.

FIG. 12 is a schematic diagram illustrating a relation between the color gamut that can be reproduced with the light emitting capability of each sub-pixel 49 included in the display device 10 and the color gamut of the display device 10 that is actually output by combining the colors of the sub-pixels 49. Suppose that the color gamut that can be reproduced with the light emitting capability of each sub-pixel 49 included in the display device 10 and the color gamut of the display device 10 that is actually output by combining the colors of the sub-pixels 49 are the same color gamut L1, that is, suppose that a maximum color gamut based on potential of the light emitting capability of the sub-pixel 49 of the display device 10 is the same as an effective color gamut that can be visually recognized in the display output performed by the display device 10. In outputting one primary color having a maximum gradation value, the display device 10 causes the sub-pixel 49 of the primary color to be lit with a maximum light emitting capability. In other words, under the above hypothetical condition, the display device 10 cannot cause the sub-pixel 49 of another color to be lit in outputting one primary color having the maximum gradation value. This is because, if the sub-pixel 49 of another color is lit, a reproduced color of the display device 10 is shifted in a direction of the lit color, and an output as the primary color cannot be obtained. For example, if the sub-pixel 49 of another color is lit when red (R) is to be output with the maximum gradation value, the reproduced color is brought close to any of the colors other than red (R) and becomes a color not corresponding to the primary color of red (R). The same applies to the other primary colors. When the sub-pixel 49 of another color cannot be lit in outputting one primary color having the maximum gradation value, only the sub-pixel 49 of the one primary color is lit as content of display output, which may be visually recognized as granularity related to display depending on definition of the pixel 48 and the sub-pixel 49.

As a method for reducing such granularity, for example, as illustrated in FIG. 12, a color gamut (denoted by reference numeral L2) that can be reproduced with the light emitting capability of each sub-pixel included in the display device 10 may be caused to be larger than the color gamut (denoted by reference numeral L1) of the display device 10 actually output by combining the colors of the sub-pixels to cause the sub-pixels 49 of colors other than the primary color to be lit in outputting the one primary color having the maximum gradation value. For example, to output red (R) with the maximum gradation value of the "actually output color gamut of the display device 10", a target color corresponds to the reference numeral P1 of the color gamut L1 in FIG. 12. Suppose that when the first sub-pixel 49R included in the display device 10 is lit with the maximum light emitting capability, the other sub-pixels 49 are not lit. The color to be output corresponds to the reference numeral P2 positioned on an outer side than the reference numeral P1 of the color gamut L1 in FIG. 12. In this case, the color is deviated from the "actually output color gamut of the display device 10". However, by causing the sub-pixel 49 of another color to be lit, a color component of light to be output can be brought close to the "actually output color gamut of the display device 10". For example, by causing both green (G) and blue (B) to be lit, the color can be shifted from the reference numeral P2 toward the reference numeral P1 as represented by the arrow V. The color can be shifted from the reference numeral P2 toward the reference numeral P1 also by causing the pixel 48 to be lit and outputting the white (W) component. Two or more lighting patterns as exemplified above for "shifting the color from P2 toward the reference numeral P1" can be combined. A case of reproducing the color of red (R) has been described above as an example. Also in a case of outputting another primary color or another complementary color, the sub-pixel of a color other than a "color intended to be reproduced" can be lit. That is, when the light emitting capability of each sub-pixel 49 is higher than the light emitting capability required for the color gamut of the display device 10 reproduced by combining the colors of the sub-pixels 49, more sub-pixels 49 can be lit irrespective of the output color. Accordingly, the granularity can be further reduced irrespective of the content of the display output, and the resolution corresponding to real resolution is easily exhibited.

As described above, with the display device 10 according to the first embodiment, the resolution corresponding to the real resolution can be obtained with the pixel 48 of high luminance color irrespective of the sub-pixel 49, so that a correlation between the resolution and the number of sub-pixels 49 can be lowered. Thus, reduction in a mounting area assigned to one sub-pixel 49 with higher resolution can be further suppressed. Accordingly, in securing the resolution, an increase in the number of sub-pixels 49 with an increase in the number of pixels 48 due to higher resolution can be further suppressed, so that an increase in driving power for the sub-pixel 49 can be further suppressed. The pixels 48 and the sub-pixels 49 are arranged in a staggered manner, so that the sub-pixel of the first primary color (first sub-pixel 49R), the sub-pixel of the second primary color (second sub-pixel 49G), and the sub-pixel of the third primary color (third sub-pixel 49B) are adjacent to each of the pixels 48, whereby color reproduction using these primary colors and the resolution with the pixels 48 can be both achieved.

The high luminance color is white (W), so that output of contrast using intensity of white light can be performed with higher efficiency with the pixel 48. The efficiency herein means luminance and brightness with respect to power consumption.

The white component as a component that can be output as white is extracted from color components indicated by an input signal, the extracted white component is assigned to a corresponding pixel 48, and a component other than the white component in the color components indicated by the input signal is assigned to a sub-pixel 49. As a result, the color reproduction using the primary colors of the sub-pixels 49 and the resolution obtained by reproducing the contrast of white of the pixels 48 can both be achieved.

A color gamut the vertexes of which correspond to the colors of the sub-pixels and that represents a color range that can be output by the display device is larger than the color gamut of the image visually recognized as a result of display output by the display device and contains the color gamut of the image, so that granularity related to display can be reduced.

Second Embodiment

Figure 13:
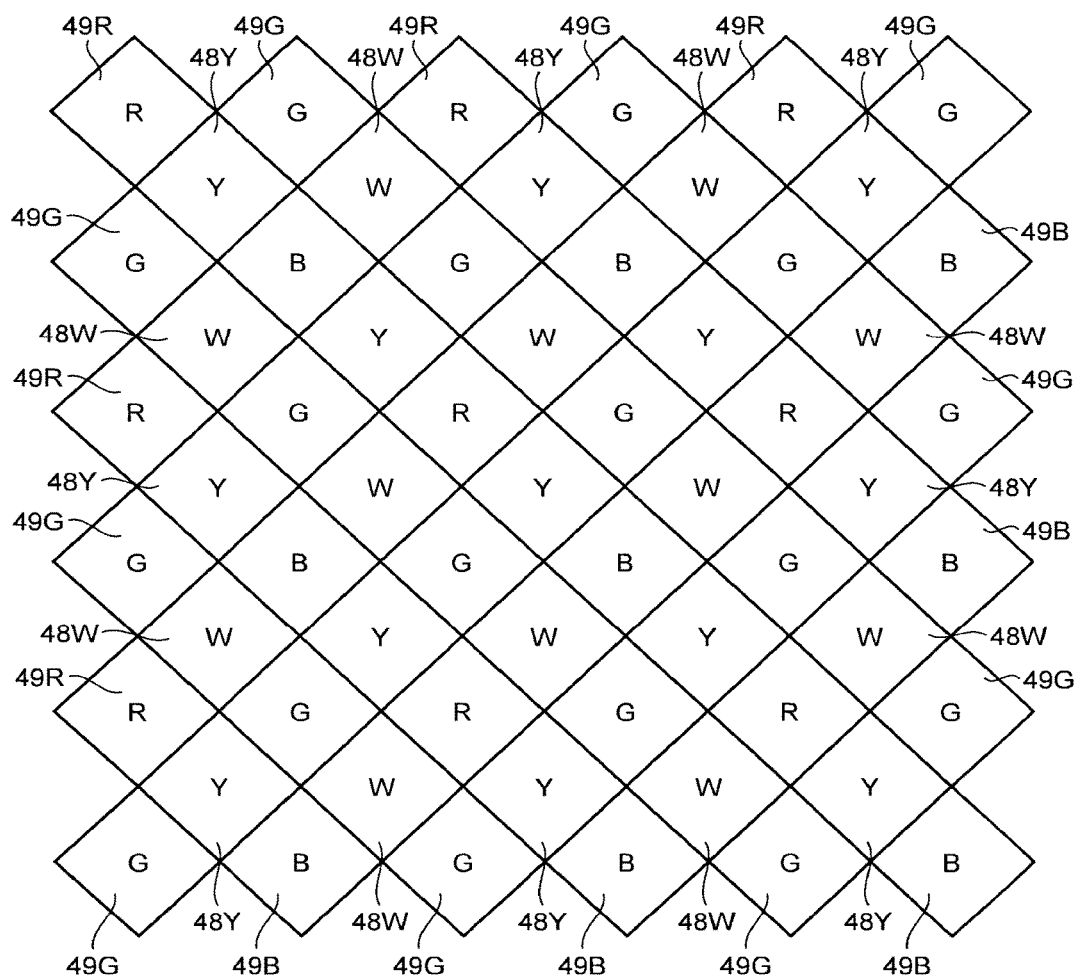
FIG. 13 is a schematic diagram illustrating an arrangement of pixels and sub-pixels of an image display panel according to a second embodiment.
Figure 14:
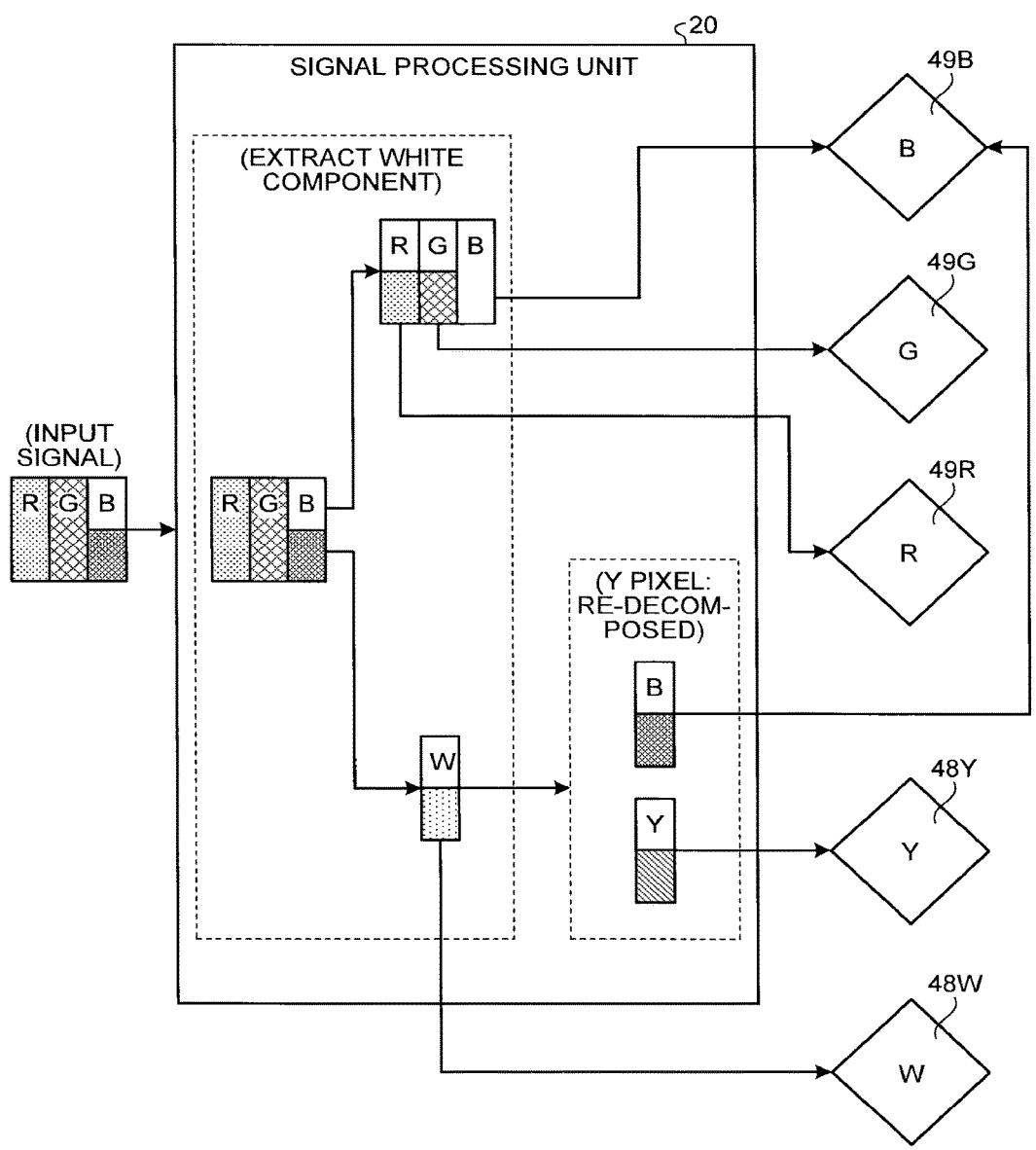
FIG. 14 is a schematic diagram illustrating an example of content of processing performed by a signal processing unit according to the second embodiment.
Figure 15:
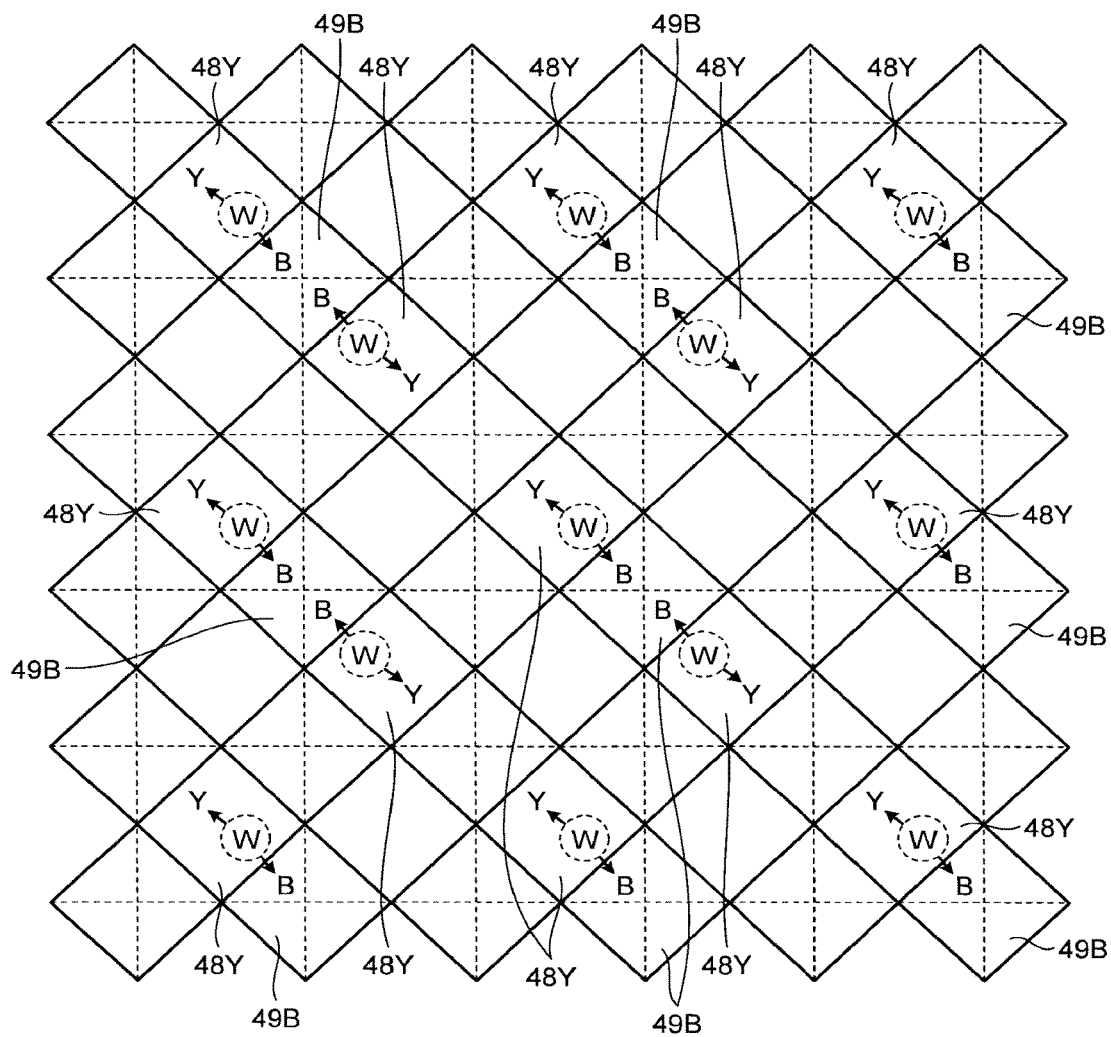
FIG. 15 is a schematic diagram illustrating a mechanism for reproducing white light by combining a pixel of yellow (Y) and a third sub-pixel.

Next, the following describes a display device according to a second embodiment of the present invention with reference to FIGS. 13 to 15. The same configurations as those in the first embodiment may be denoted by the same reference numerals, and descriptions thereof will not be repeated in some cases. The second embodiment is the same as the first embodiment except that the high luminance color as the color of the pixel 48 is not limited to white, and except for specific content of the signal processing performed by the signal processing unit 20 based on the color of the pixel 48.

FIG. 13 is a schematic diagram illustrating an arrangement of the pixels and the sub-pixels of the image display panel 40 according to the second embodiment. As illustrated in FIG. 13, high luminance colors in the second embodiment are white (W) and yellow (Y). In the second embodiment, the colors of the pixels 48 adjacent to each other in the row and the column directions are different from each other. That is, as illustrated in FIG. 13, in the row of pixels 48 according to the second embodiment, a pixel 48W as a pixel of white (W) and a pixel 48Y as a pixel of yellow (Y) are alternately arranged along the row direction. In the column of the pixels 48 according to the second embodiment, the pixel 48W and the pixel 48Y are alternately arranged along the column direction. Hereinafter, in descriptions in which the colors of the pixels are not required to be distinguished from each other, or in which all the pixels are included irrespective of the colors, the pixels 48W and 48Y may be simply described as the pixels 48. FIG. 13 is merely a schematic diagram for representing the arrangement, and size comparison between the pixels 48 and the sub-pixels 49 and the shapes of the pixels 48 and the sub-pixels 49 according to the second embodiment may be the same as those in the first embodiment described with reference to FIG. 11.

FIG. 14 is a schematic diagram illustrating an example of content of processing performed by the signal processing unit 20 according to the second embodiment. The signal processing unit 20 according to the second embodiment extracts the white component as a component that can be output as white from color components indicated by an input signal, assigns, to the white pixel, the white component extracted from an input signal for coordinates at which the white pixel is disposed, assigns, to a yellow pixel and a sub-pixel of the third primary color, the white component extracted from an input signal for coordinates at which the pixel of yellow (Y) is disposed, and assigns, to a sub-pixel, a component other than the white component in the color components indicated by each of the input signals. Specifically, the signal processing unit 20 according to the second embodiment performs processing related to output from the pixel 48W as the white pixel similarly to the processing related to output from the pixel 48 according to the first embodiment. Regarding the pixel 48Y as the pixel of yellow (Y), the signal processing unit 20 re-decomposes the white component into the blue component and the yellow component, assigns the blue component to the third sub-pixel 49B, and assigns the yellow component to the pixel 48Y.

FIG. 15 is a schematic diagram illustrating a mechanism for reproducing white light by combining the pixel 48Y and the third sub-pixel 49B. Similarly to the first embodiment, in the second embodiment, a plurality of sub-pixels 49 are arranged so that the first sub-pixel 49R as the sub-pixel of red (R), the second sub-pixel 49G as the sub-pixel of green (G), and the third sub-pixel 49B as the sub-pixel of blue (B) are adjacent to one pixel 48. Due to this, the third sub-pixel 49B is naturally adjacent to the pixel 48Y. In the second embodiment, as illustrated in FIG. 15, an output of white is reproduced by outputting light corresponding to the blue component with the third sub-pixel 49B and outputting light corresponding to the yellow component with the pixel 48Y. That is, the third primary color is blue in the second embodiment, so that the white component for the coordinates at which the pixel 48Y as the pixel of yellow (Y) is disposed can be output with the third sub-pixel 49B and the pixel 48Y.

The pixel 48Y as the pixel of yellow (Y) has higher luminance than that of the third sub-pixel 49B as the sub-pixel of blue (B). Due to this, luminance center of gravity is present on the pixel 48Y side when both of the third sub-pixel 49B and the pixel 48Y emit light for reproducing the white component. When visually recognizing such a display region including the third sub-pixel 49B and the pixel 48Y, a user recognizes that a light source of white light is lit at the position of the pixel 48Y. Due to this mechanism, the display device according to the second embodiment obtains real resolution equivalent to that in the first embodiment.

The pixel of yellow (Y) is provided, thus, in outputting the yellow component, the yellow component can be output with higher efficiency by causing the pixel of yellow (Y) to be lit as compared with a case of outputting the yellow component by causing the sub-pixels of red (R) and green (G) to be lit. Specifically, light emission efficiency of yellow (Y) in the display device of organic light emitting diode (OLED) type as illustrated in FIG. 3 is as high as that of white (W), so that display output including output of the yellow component can be performed with higher efficiency and lower power consumption.

The high luminance colors are white (W) and yellow (Y) in the second embodiment. Therefore, in addition to the same advantages as those in the first embodiment, the display device of the second embodiment can provide resolution obtained by reproducing contrast and also provide the display output with high efficiency and low power consumption due to presence of yellow (Y).

The third primary color is blue, the white component as a component that can be output as white is extracted from color components indicated by an input signal, the white component extracted from an input signal for the coordinates at which a pixel 48W of white (W) is disposed is assigned to the pixel 48W of white (W), the white component extracted from an input signal for the coordinates at which a pixel 48Y of yellow (Y) is disposed is assigned to the pixel 48Y of yellow (Y) and the sub-pixel of the third primary color (third sub-pixel 49B), and a component other than the white component in the color components indicated by each of the input signals is assigned to a sub-pixel 49, whereby resolution obtained by substantially reproducing contrast of white light at the positions of the pixels 48 irrespective of the color of the pixels 48 and color reproduction using the primary colors of the sub-pixels 49 can both be achieved.

Third Embodiment

Figure 16:
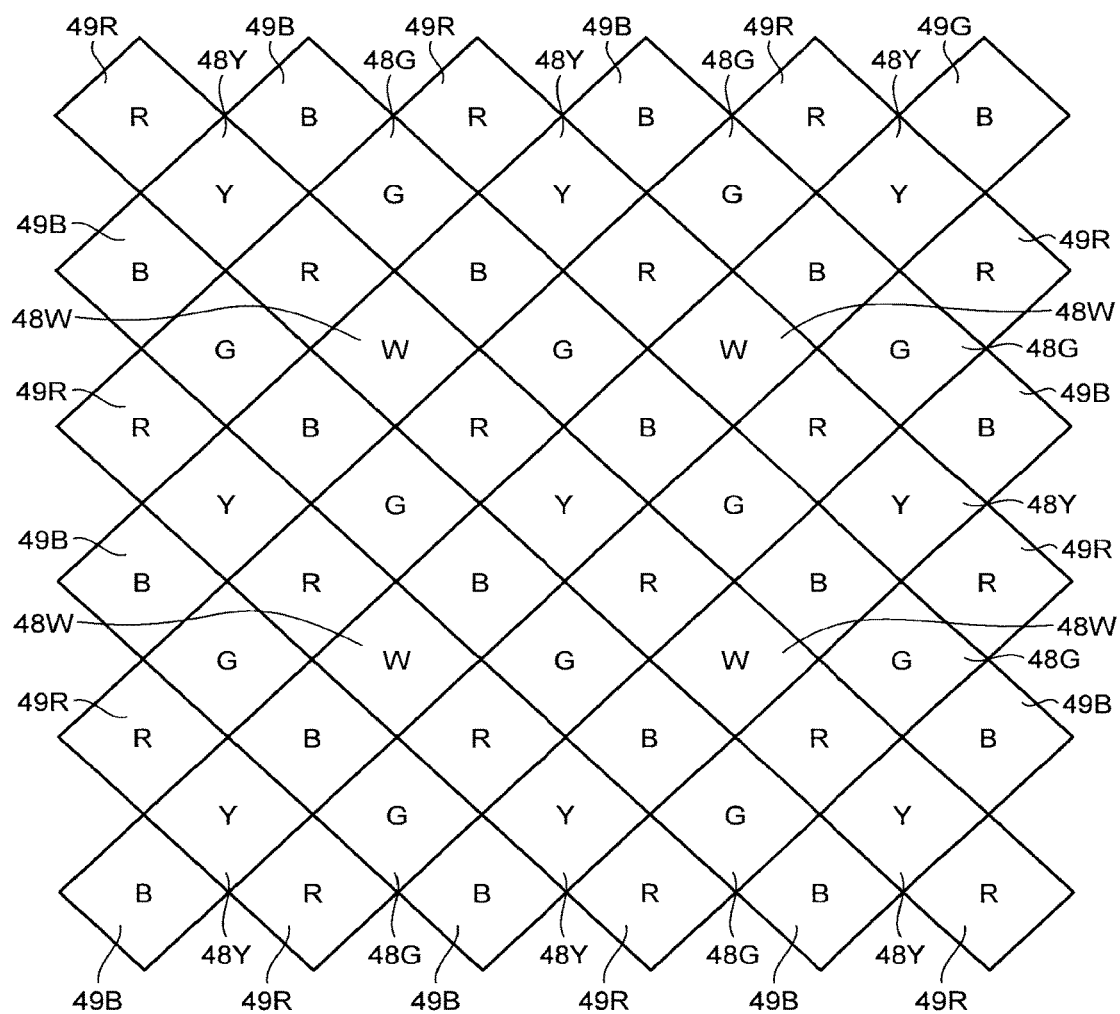
FIG. 16 is a schematic diagram illustrating an arrangement of pixels and sub-pixels of an image display panel according to a third embodiment.
Figure 17:
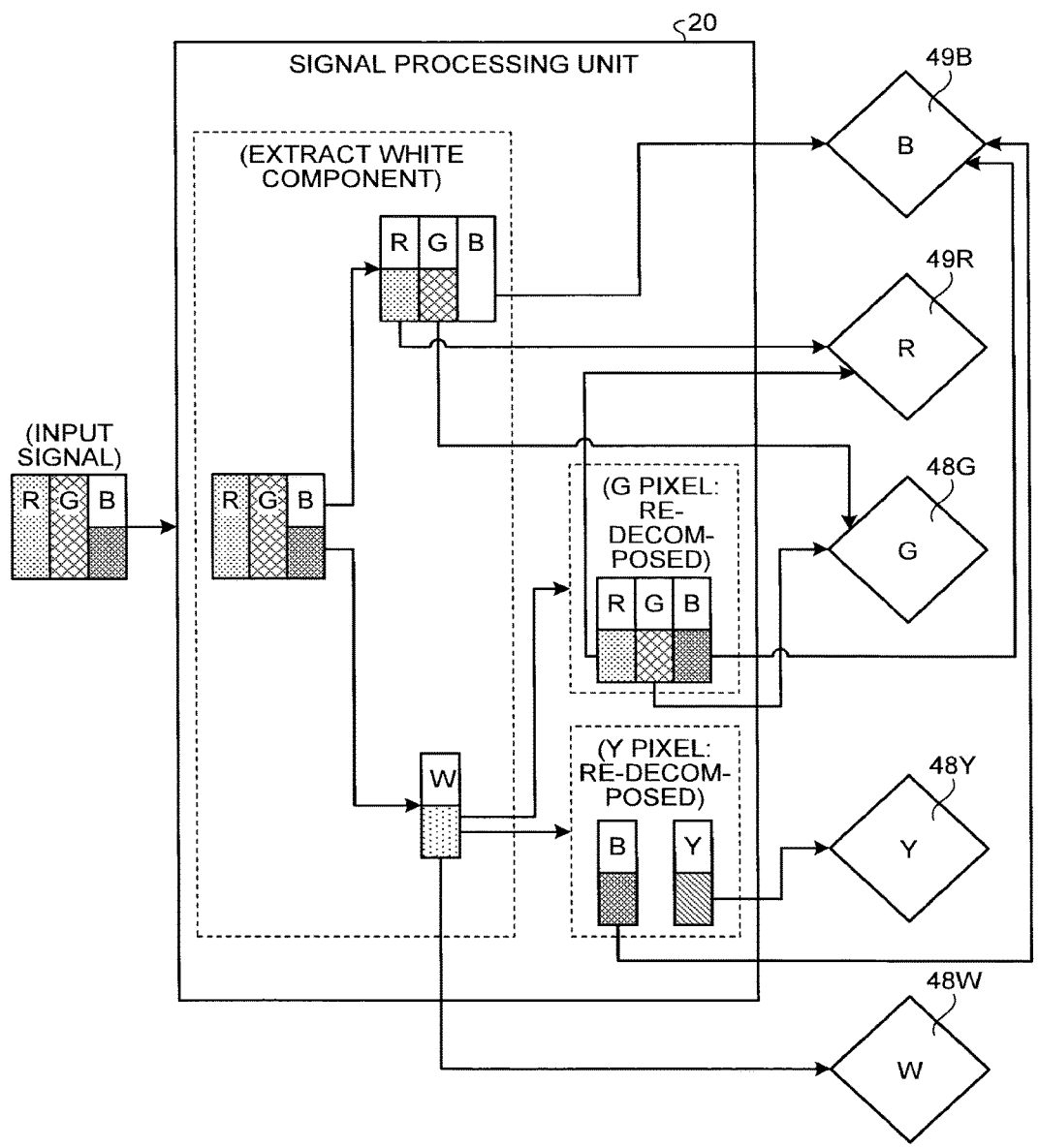
FIG. 17 is a schematic diagram illustrating an example of content of processing performed by a signal processing unit according to the third embodiment.
Figure 18:
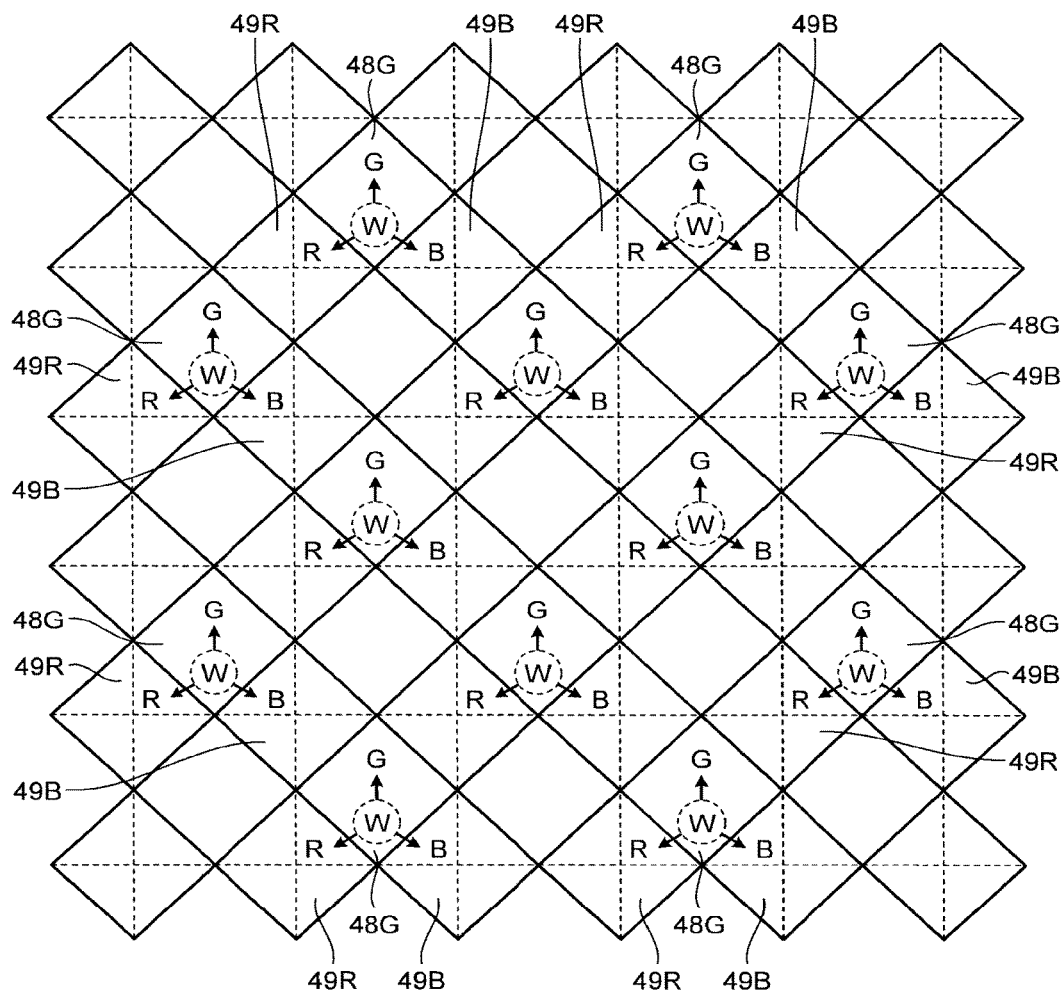
FIG. 18 is a schematic diagram illustrating a mechanism for reproducing white light by combining a pixel of green (G), a first sub-pixel, and a third sub-pixel.

Next, the following describes a display device according to a third embodiment of the present invention with reference to FIGS. 16 to 18. The same configurations as those in the first embodiment may be denoted by the same reference numerals, and descriptions thereof will not be repeated in some cases. The third embodiment is the same as the first embodiment except that the high luminance color as the color of the pixel 48 is not limited to white, and except for specific content of the signal processing performed by the signal processing unit 20 based on the color of the pixel 48.

FIG. 16 is a schematic diagram illustrating the arrangement of the pixels and the sub-pixels of the image display panel 40 according to the third embodiment. The display device according to the third embodiment includes a plurality of pixels 48 arranged at respective positions corresponding to the coordinates in the row and the column directions indicated by the input signal and a plurality of sub-pixels 49 arranged among the pixels 48. The pixels 48 and the sub-pixels 49 are arranged in a staggered manner. The color of the sub-pixels 49 is red (R) or blue (B). The sub-pixels 49 are arranged so that the sub-pixel of red (R) and the sub-pixel of blue (B) are adjacent to each of the pixels 48. The color of each of the pixels 48 is any of a plurality of high luminance colors having higher luminance than those of the colors of the sub-pixels 49, and one of the high luminance colors is yellow.

Specifically, as illustrated in FIG. 16 for example, the sub-pixels 49 according to the third embodiment include a first sub-pixel 49R or a third sub-pixel 49B, and does not include a second sub-pixel 49G. Specifically, in the row of sub-pixels 49 according to the third embodiment, the first sub-pixel 49R and the third sub-pixel 49B are alternately arranged along the row direction. In the column of the sub-pixels 49 according to the third embodiment, the first sub-pixel 49R and the third sub-pixel 49B are alternately arranged along the column direction. The colors of the pixels 48 according to the third embodiment are white, yellow, and green. Specifically, in the third embodiment, a row of pixels in which the pixel 48W as the pixel of white (W) and a pixel 48G as the pixel of green (G) are alternately arranged along the row direction and a row of pixels in which the pixel 48Y as the pixel of yellow (Y) and the pixel 48G are alternately arranged along the row direction are alternately arranged along the column direction. A column of pixels in which the pixel 48W and the pixel 48G are alternately arranged along the column direction and a column of pixels in which the pixel 48Y and the pixel 48G are alternately arranged along the column direction are alternately arranged along the row direction. FIG. 16 is merely a schematic diagram for representing the arrangement, and size comparison between the pixels 48 and the sub-pixels 49 and the shapes of the pixels 48 and the sub-pixels 49 according to the third embodiment may be the same as those in the first embodiment described with reference to FIG. 11.

FIG. 17 is a schematic diagram illustrating an example of content of processing performed by the signal processing unit 20 according to the third embodiment. The signal processing unit 20 according to the third embodiment extracts the white component as a component that can be output as white from color components indicated by an input signal, assigns the extracted white component to a corresponding pixel 48, or to the pixel 48 and a sub-pixel 49 of a color that can reproduce intensity of white light by being combined with the color of the pixel 48, and assigns, to a sub-pixel 49, a component that is other than the white component and that can be reproduced with the color of the sub-pixel 49 in the color components indicated by the input signal. Specifically, the signal processing unit 20 according to the third embodiment performs processing related to output from the pixel 48W as the white pixel similarly to the processing related to output from the pixel 48 according to the first embodiment. The signal processing unit 20 according to the third embodiment performs processing related to output from the pixel 48Y as the pixel of yellow (Y) similarly to the processing related to output from the pixel 48Y according to the second embodiment. Regarding the pixel 48G as the pixel of green (G), the signal processing unit 20 re-decomposes the white component into the red component, the green component, and the blue component, assigns the red component to the first sub-pixel 49R, assigns the green component to the pixel 48G, and assigns the blue component to the third sub-pixel 49B.

FIG. 18 is a schematic diagram illustrating a mechanism for reproducing white light by combining the pixel 48G, the first sub-pixel 49R, and the third sub-pixel 49B. In the third embodiment, a plurality of sub-pixels 49 are arranged so that the first sub-pixel 49R as the sub-pixel of red (R) and the third sub-pixel 49B as the sub-pixel of blue (B) are adjacent to one pixel 48. Due to this, the first sub-pixel 49R and the third sub-pixel 49B are naturally adjacent to the pixel 48G. In the third embodiment, as illustrated in FIG. 18, light corresponding to the green component, the red component, and the blue component is output with the pixel 48G, and the first sub-pixel 49R and the third sub-pixel 49B adjacent to the pixel 48G to reproduce the output of white color.

The pixel 48G as the pixel of green (G) has higher luminance than that of the first sub-pixel 49R as the sub-pixel of red (R) and the third sub-pixel 49B as the sub-pixel of blue (B). Due to this, the luminance center of gravity is present on the pixel 48G side when the pixel 48G, the first sub-pixel 49R, and the third sub-pixel 49B emit light for reproducing the white component. When visually recognizing such a display region including the pixel 48G, the first sub-pixel 49R, and the third sub-pixel 49B, the user recognizes that the light source of white light is lit at the position of the pixel 48G. Due to this mechanism, the display device according to the third embodiment obtains real resolution equivalent to that in the first embodiment.

Figure 19:
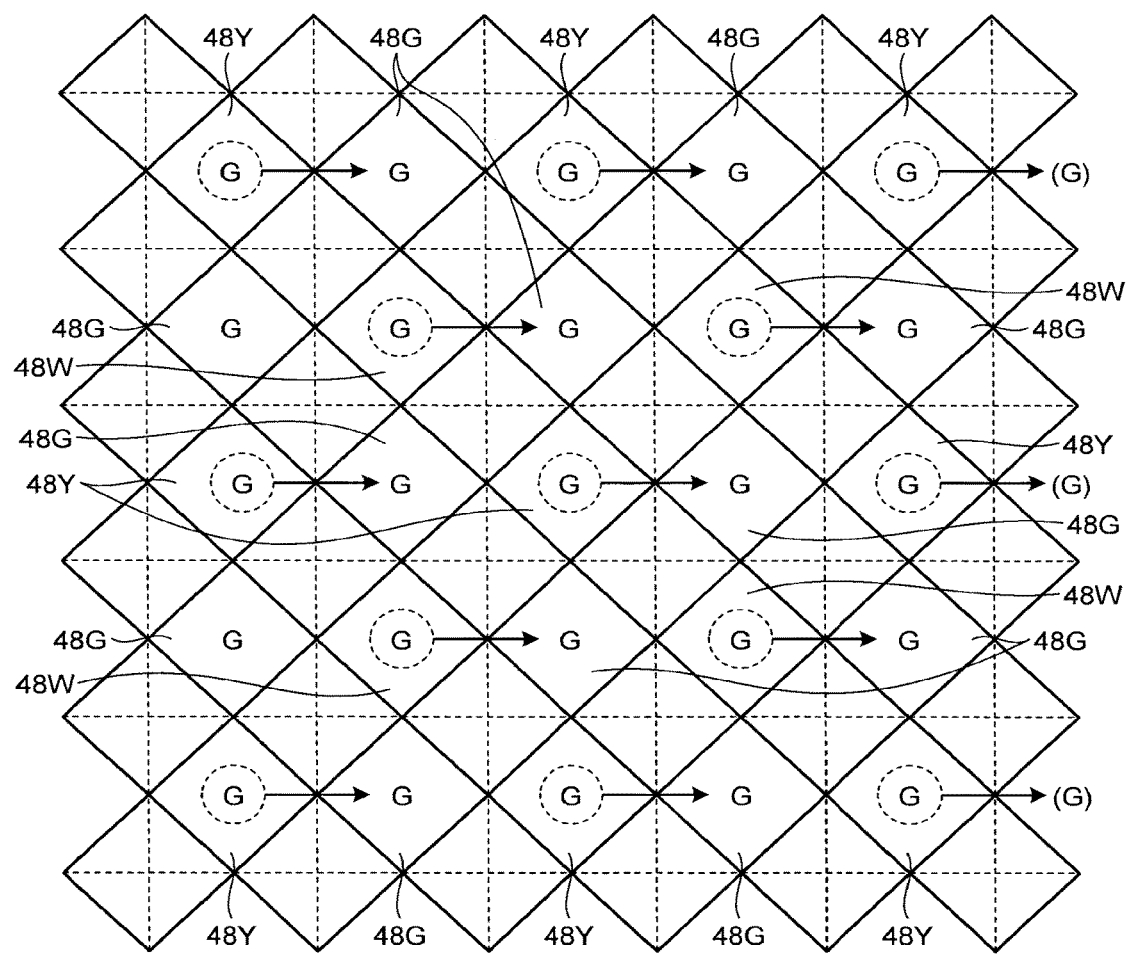
FIG. 19 is a diagram illustrating an example of a method for assigning a green component.

FIG. 19 is a diagram illustrating an example of a method for assigning the green component. In the third embodiment, the green component among color components indicated by an input signal corresponding to each set of coordinates is assigned to the pixel 48G. Specifically, as illustrated in FIG. 19, the signal processing unit 20 according to the third embodiment assigns the green component among the color components indicated by the input signal corresponding to the coordinates of a pixel other than the pixel 48G, that is, the pixel 48W or the pixel 48Y, to the pixel 48G adjacent the pixel 48W or the pixel 48Y. The pixel 48G according to the third embodiment has a light emitting capability for outputting the green components indicated by the input signals for two pixels 48.

As described above, according to the third embodiment, the resolution corresponding to the real resolution can be obtained with the pixel 48 of high luminance color, so that reduction in the mounting area assigned to one sub-pixel 49 in accordance with higher resolution can be further suppressed. Accordingly, in securing the resolution, an increase in the number of sub-pixels 49 in accordance with an increase in the number of pixels 48 due to higher resolution can be further suppressed, so that an increase in driving power for the sub-pixel 49 can be further suppressed. The pixels 48 and the sub-pixels 49 are arranged in a staggered manner, so that the sub-pixel of the first primary color (first sub-pixel 49R) and the sub-pixel of the third primary color (third sub-pixel 49B) are adjacent to each of the pixels 48, whereby color reproduction using these primary colors and the resolution with the pixels 48 can be both achieved.

The white component as a component that can be output as white is extracted from color components indicated by an input signal, the extracted white component is assigned to a corresponding pixel 48, or to the pixel 48 and a sub-pixel 49 of a color that can reproduce intensity of white light by being combined with the color of the pixel 48, and a component that is other than the white component and that can be reproduced with the color of a sub-pixel 49 in the color components indicated by the input signal is assigned to the sub-pixel 49, whereby color reproduction using the primary colors of the sub-pixels 49 and the resolution with the pixels 48 can both be achieved.

The colors of the pixels 48 are white (W), yellow (Y), and green (G), so that the same advantages as those in the first and the second embodiments can be obtained with the pixel 48W of white (W) and the pixel 48Y of yellow (Y), and both of the white component and the components other than the white component can be output using the pixel 48G of green (G), the first sub-pixel 49R of red (R), and the third sub-pixel 49B of blue (B). Thus, color reproduction using the RGB colors and the resolution with the pixels 48 can both be achieved.

In the third embodiment, the number of sub-pixels of red (R) and blue (B) can be increased as compared with the first and the second embodiments, so that the red component and the blue component among the color components indicated by the input signal can be output using a larger number of sub-pixels 49, and the resolution can be more easily enhanced in the output of these color components.

Fourth Embodiment

Next, the following describes a fourth embodiment of the present invention. A display device 10c according to the fourth embodiment is different from the display device 10 according to the first to the third embodiments in that the image display panel is a reflective liquid crystal display panel. The display device 10c according to the fourth embodiment has the same configurations as those in the first to the third embodiments except for the image display panel, so that descriptions thereof will not be repeated.

Figure 20:
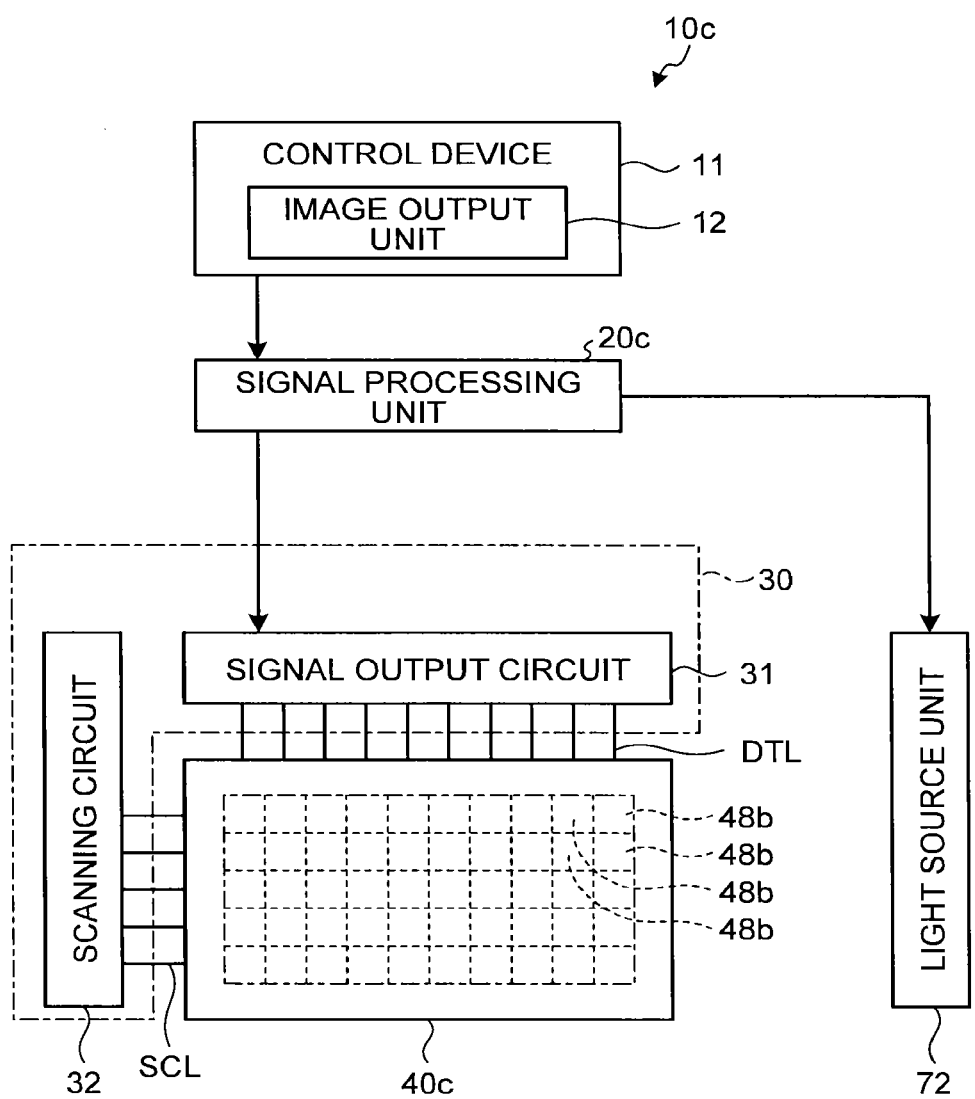
FIG. 20 is a block diagram illustrating an example of a configuration of a display device according to a fourth embodiment.

FIG. 20 is a block diagram illustrating an example of the configuration of the display device according to the fourth embodiment. As illustrated in FIG. 20, the display device 10c according to the fourth embodiment includes a signal processing unit 20c, an image display panel 40c, and a light source unit 72. The display device 10c causes the image display panel 40c to reflect external light to display an image. In a case of being used outdoors at night or used in a dark place in which external light is insufficient, the display device 10c can display an image by reflecting light emitted from the light source unit 72 on the image display panel 40c.

Figure 21:
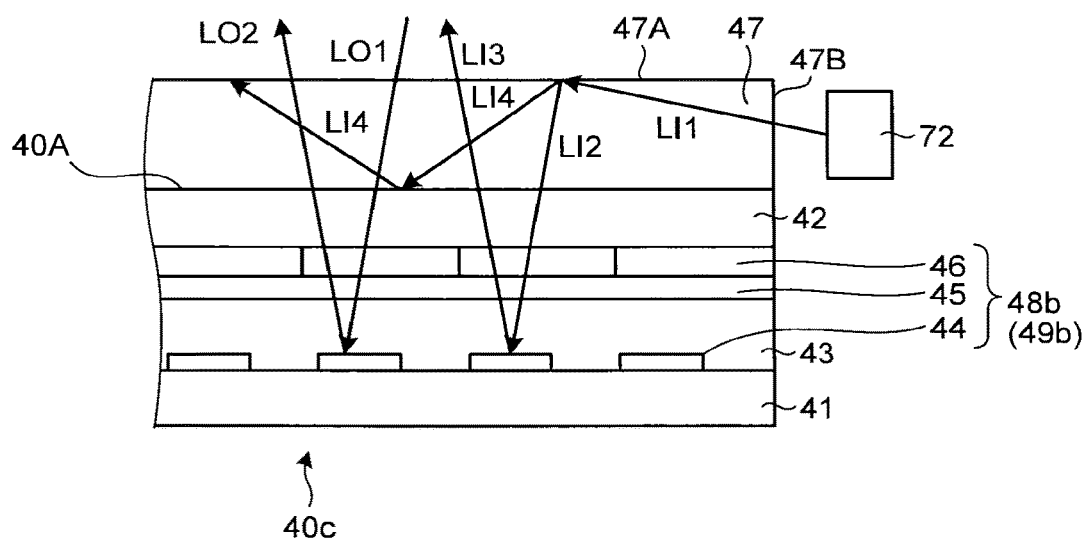
FIG. 21 is a cross-sectional view schematically illustrating a structure of an image display panel according to the fourth embodiment.

FIG. 21 is a cross-sectional view schematically illustrating a structure of the image display panel according to the fourth embodiment. As illustrated in FIG. 21, the image display panel 40c includes an array substrate 41 and a counter substrate 42 opposed to each other, and a liquid crystal layer 43 in which liquid crystal elements are sealed is arranged between the array substrate 41 and the counter substrate 42.

A plurality of pixel electrodes 44 are arranged on a surface of the array substrate 41 on the liquid crystal layer 43 side. The pixel electrode 44 is coupled to the signal line DTL via the switching element, and receives an image output signal as a video signal applied thereto. Each of the pixel electrodes 44 is, for example, a reflective member made of aluminum or silver, and reflects external light or light from the light source unit 72. That is, in the fourth embodiment, the pixel electrode 44 constitutes a reflection unit, and the reflection unit reflects light emitted from a front surface (a surface on which an image is displayed) of the image display panel 40c to display an image.

The counter substrate 42 is a transparent substrate made of glass, for example. The counter substrate 42 includes a counter electrode 45 and a color filter 46 arranged on a surface thereof on the liquid crystal layer 43 side. More specifically, the counter electrode 45 is arranged on a surface of the color filter 46 on the liquid crystal layer 43 side.

The counter electrode 45 is made of a transparent conductive material such as indium tin oxide (ITO) or indium zinc oxide (IZO), for example. The counter electrode 45 is coupled to the switching element to which the pixel electrode 44 is coupled. The pixel electrode 44 and the counter electrode 45 are arranged being opposed to each other, so that, when a voltage caused by the image output signal is applied between the pixel electrode 44 and the counter electrode 45, the pixel electrode 44 and the counter electrode 45 generate an electric field in the liquid crystal layer 43. The liquid crystal elements are twisted due to the electric field generated in the liquid crystal layer 43 and a double refractive index is changed. The display device 10c adjusts an amount of light reflected from the image display panel 40c. The image display panel 40c is what is called a vertical electric field type image display panel. Alternatively, the image display panel 40c may be a horizontal electric field type image display panel that causes an electric field to be generated in a direction parallel with a display surface of the image display panel 40c.

A plurality of color filters 46 are arranged corresponding to the pixel electrodes 44. The pixel electrode 44, the counter electrode 45, and the color filter 46 constitute a pixel 48b and a sub-pixel 49b according to the fourth embodiment. A light guide plate 47 is arranged on a surface of the counter substrate 42 opposite to the liquid crystal layer 43 side. The light guide plate 47 is made of a transparent plate member such as an acrylic resin, a polycarbonate (PC) resin, and a methylmethacrylate-styrene copolymer (MS resin), for example. Prism processing is performed on an upper surface 47A of the light guide plate 47 opposite to the counter substrate 42 side.

The light source unit 72 is an LED in the fourth embodiment. As illustrated in FIG. 21, the light source unit 72 is arranged along a side surface 47B of the light guide plate 47. The light source unit 72 irradiates the image display panel 40c with light from the front surface of the image display panel 40c via the light guide plate 47. The light source unit 72 is turned ON/OFF through an operation performed by an image observer, or using an external light sensor and the like that is attached to the display device 10c to measure external light. The light source unit 72 emits light in an ON state, and does not emit light in an OFF state. For example, when the image observer feels that the image is dark, the image observer turns ON the light source unit 72, and causes the light source unit 72 to irradiate the image display panel 40c with light to brighten the image. When the external light sensor determines that external light intensity is smaller than a predetermined value, for example, the signal processing unit 20c turns ON the light source unit 72 and causes the light source unit 72 to irradiate the image display panel 40c with light to brighten the image.

Next, the following describes reflection of light from the image display panel 40c. As illustrated in FIG. 21, external light LO1 is incident on the image display panel 40c. The external light LO1 is incident on the pixel electrode 44 through the light guide plate 47 and the inside of the image display panel 40c. The external light LO1 incident on the pixel electrode 44 is reflected from the pixel electrode 44, and emitted to the outside as light LO2 through the inside of the image display panel 40c and the inside of the light guide plate 47. When the light source unit 72 is turned ON, light LI1 from the light source unit 72 enters the light guide plate 47 through the side surface 47B of the light guide plate 47. The light LI1 that has entered the light guide plate 47 is scattered by and reflected from the upper surface 47A of the light guide plate 47, and part of the light LI1 enters the image display panel 40c as light LI2 from the counter substrate 42 side of the image display panel 40c to be emitted to the pixel electrode 44. The light LI2 emitted to the pixel electrode 44 is reflected from the pixel electrode 44, and emitted to the outside as light LI3 through the image display panel 40c and the light guide plate 47. The other part of the light scattered by the upper surface 47A of the light guide plate 47 is reflected as light LI4, is further reflected from a boundary surface 40A between the light guide plate 47 and the counter substrate 42, and is repeatedly reflected in the light guide plate 47.

That is, the pixel electrode 44 reflects the external light LO1 or the light LI2 to the outside, the external light LO1 or the light LI2 being incident on the image display panel 40c from the front surface as a surface on an outer side (the counter substrate 42 side) of the image display panel 40c. The light LO2 and the light LI3 reflected to the outside pass through the liquid crystal layer 43 and the color filter 46. Accordingly, the display device 10 can display an image with the light LO2 and the light LI3 reflected to the outside. As described above, the display device 10c according to the fourth embodiment is a reflective display device including the light source unit 72 of front light type and edge light type. In the fourth embodiment, the display device 10c includes the light source unit 72 and the light guide plate 47. However, the display device 10c does not necessarily include the light source unit 72 or the light guide plate 47. In this case, the display device 10c can display an image with the light LO2 obtained by reflecting the external light L01.

Characteristics of the pixel 48b such as a color to be assigned (white, yellow, or green as the high luminance color) are the same as those of the pixel 48 in the first embodiment except that the pixel 48b is a pixel of the reflective liquid crystal display panel. Characteristics of the sub-pixel 49b such as a color to be assigned (white, yellow, or green as the high luminance color) are the same as those of the sub-pixel 49 in the first embodiment except that the sub-pixel 49b is a sub-pixel of the reflective liquid crystal display panel.

According to the fourth embodiment, the same advantages as those in the first to the third embodiments described above can be obtained by employing the arrangement of the pixels 48 and the sub-pixels 49 and the signal processing performed by the signal processing unit 20 according to any of the first to the third embodiments.

The colors and the arrangements of the pixels 48 and the sub-pixels 49 in the embodiments described above are merely an example, and not limited thereto. The colors and the arrangements thereof can be appropriately modified within a range specified by matters specifying the claimed invention. For example, a ratio between the number of the pixels 48W and the number of the pixels 48Y in the second and the third embodiments is not limited to 1:1. The pixel 48W according to the third embodiment may be replaced with the pixel 48Y or the pixel 48G. The pixel 48W may be replaced with a color having higher luminance (for example, cyan (C)) than that of the color of the sub-pixel 49.

The present invention naturally encompasses other working advantages caused by the aspects described in the above embodiments that are obvious from the description herein or that are conceivable as appropriate by those skilled in the art.

What is claimed is:

1. A display device comprising:
a plurality of pixels each having a first diagonal line and a second diagonal line, the pixels being arranged in a matrix of a first direction along the first diagonal line and a second direction along the second diagonal line, the pixels each having four vertices and four sides; and
a plurality of sub-pixels arranged in a matrix of the first direction and the second direction, the sub-pixels each having four sides,
wherein
each of colors of the sub-pixels is a sub-pixel color that is any of a first primary color, a second primary color, or a third primary color,
each of colors of the pixels is a pixel color that has luminance higher than luminance of any one of a plurality of the sub-pixel colors,
the pixels and the sub-pixels are arranged in a staggered manner so that the four vertices of each pixel are in contact with the vertices of the pixels surrounding the each pixel and so that the four sides of the each pixel, having the pixel color, are in contact with the sides of the sub-pixels surrounding the each pixel, the sub-pixels each having one of the sub-pixel colors,
the sub-pixels are arranged so that a sub-pixel of the first primary color, a sub-pixel of the second primary color, and a sub-pixel of the third primary color are adjacent to the each of the pixel r pixel having the pixel color that has higher luminance than the luminance of any one of the sub-pixel colors.

2. The display device according to claim 1, wherein the pixel color is white.

3. The display device according to claim 2, further comprising:
a signal processing unit configured to extract a white component as a component that is able to be output as white from color components indicated by an input signal, assign the extracted white component to a corresponding pixel, and assign a component other than the white component in the color components indicated by the input signal to a sub-pixel.

4. The display device according to claim 2, wherein
first sub-pixels are the sub-pixels that surround the pixel having the pixel color of white, and
a ratio of counts of the first sub-pixels having the sub-pixel color of red, green, or blue is 1:2:1, respectively.

5. The display device according to claim 1, wherein
a plurality of the is pixel colors of the pixels include white and yellow,
the colors of the pixels adjacent to each other in the first and the second directions are different from each other,
the pixels include a white pixel and a yellow pixel,
the four vertices of the white pixel are in contact with the vertices of the yellow pixels that surround the white pixel.

6. The display device according to claim 5, wherein the third primary color is blue, and
the display device further comprises a signal processing unit configured to:
extract a white component as a component that is able to be output as white from color components indicated by an input signal;
assign, to the white pixel, the white component extracted from an input signal for coordinates at which the white pixel is disposed;
assign, to the yellow pixel and a sub-pixel of the third primary color, the white component extracted from an input signal for coordinates at which the yellow pixel is disposed; and
assign, to a sub-pixel, a component other than the white component in the color components indicated by each of the input signals.

7. The display device according to claim 5, wherein
second sub-pixels are the sub-pixels that surround the white pixel or the yellow pixel, and
a ratio of counts of the second sub-pixels having the sub-pixel color of red, green, or blue is 1:2:1, respectively.

8. The display device according to claim 1, wherein the first primary color, the second primary color, and the third primary color are red, green, and blue, respectively.

9. A display device comprising:
a plurality of pixels each having a first diagonal line and a second diagonal line, the pixels being arranged in a matrix of a first direction along the first diagonal line and a second direction along the second diagonal line, the pixels each having four vertices and four sides; and
a plurality of sub-pixels arranged in a matrix of the first direction and the second direction, the sub-pixels each having four sides,
wherein
each of colors of the sub-pixels is a sub-pixel color that is red or blue,
each of colors of the pixels is a pixel color that has luminance higher than luminance of any one of a plurality of the sub-pixel colors of the sub-pixels,
the pixel color is yellow, white, or green,
the pixels and the sub-pixels are arranged in a staggered manner such that the four vertices of each pixel are in contact with the vertices of the pixels surrounding the each pixel and so that the four sides of the each pixel, having the pixel color of yellow, white or green, are in contact with the sides of the sub-pixels surrounding the each pixel, the sub-pixels each having the sub-pixel color of red or blue,
each of the four vertices of the pixel having the pixel color of green is in contact with one of the vertices of the pixels that have the pixel color of yellow or white and that surround the pixel having the pixel color of green,
the sub-pixels are arranged so that a sub-pixel having the sub-pixel color of red or blue are adjacent to the each pixel having the pixel color of yellow, white, or green, the pixel color having higher luminance than the luminance of any one of the sub-pixel colors.

10. The display device according to claim 9, further comprising
a signal processing unit configured to: extract a white component as a component that is able to be output as white from color components indicated by an input signal; assign the extracted white component to a corresponding pixel, or to the pixel and a sub-pixel of a color that is able to reproduce intensity of white light by being combined with the color of the pixel; and assign, to a sub-pixel, a component that is other than the white component and that is able to be reproduced with the color of the sub-pixel in the color components indicated by the input signal.

11. The display device according to claim 9, wherein a color gamut the vertexes of which correspond to the colors of the sub-pixels and that represents a color range that is able to be output by the display device is larger than a color gamut of an image visually recognized as a result of display output by the display device and contains the color gamut of the image.

12. The display device according to claim 9, wherein
third sub-pixels are the sub-pixels that surround the pixel having the pixel color of white, yellow, or green, and
a ratio of counts of the third sub-pixels having the sub-pixel color of red or blue is 1:1, respectively.

13. The display device according to claim 1, wherein a color gamut the vertexes of which correspond to the colors of the sub-pixels and that represents a color range that is able to be output by the display device is larger than a color gamut of an image visually recognized as a result of display output by the display device and contains the color gamut of the image.

* * * * *